United States Patent
Takaoka et al.

(10) Patent No.: US 7,258,933 B2
(45) Date of Patent: Aug. 21, 2007

(54) COATED CUTTING TOOL MEMBER

(75) Inventors: Hidemitsu Takaoka, Naka-gun (JP); Eiji Nakamura, Naka-gun (JP)

(73) Assignees: Mitsubishi Materials Corporation, Tokyo (JP); Mitsubishi Materials Kobe Tools Corporation, Hyogo-Ken (JP)

( * ) Notice: Subject to any disclaimer, the term of this patent is extended or adjusted under 35 U.S.C. 154(b) by 44 days.

(21) Appl. No.: 10/519,794

(22) PCT Filed: Jun. 20, 2003

(86) PCT No.: PCT/JP03/07866

§ 371 (c)(1),
(2), (4) Date: Dec. 22, 2004

(87) PCT Pub. No.: WO04/000494

PCT Pub. Date: Dec. 31, 2003

(65) Prior Publication Data

US 2005/0227116 A1    Oct. 13, 2005

(30) Foreign Application Priority Data

Jun. 25, 2002 (JP) .............................. 2002-183768
Jun. 25, 2002 (JP) .............................. 2002-183772

(51) Int. Cl.
    *B23B 27/14*    (2006.01)
(52) U.S. Cl. .................. 428/699; 51/307; 51/309; 427/192.12; 427/192.15; 427/192.16; 427/192.38; 428/216; 428/336; 428/698; 428/704

(58) Field of Classification Search .................. 51/307, 51/309; 428/212, 216, 336, 698, 699, 704; 427/192.1, 192.12, 192.15, 192.16, 192.38
See application file for complete search history.

(56) References Cited

U.S. PATENT DOCUMENTS 5,208,102 A    5/1993    Schulz et al.

(Continued)

FOREIGN PATENT DOCUMENTS

JP    62-056565 A    3/1987

(Continued)

OTHER PUBLICATIONS

International Search Report for PCT/JP03/07866 mailed Oct. 7, 2003.

(Continued)

*Primary Examiner*—Archene Turner
(74) *Attorney, Agent, or Firm*—Darby & Darby

(57) ABSTRACT

A coated cutting tool member exhibiting not only a superior wear resistance during a high speed cutting operation in which a significant amount of heat is generated, but also exhibit a superior shipping resistance even when such a cutting operation is performed under severe conditions, such as with a large depth of cut or a large feed. In the coated cutting tool member, a hard coating layer of one of nitride compound and carbonitride compound containing Ti and Al is formed using a physical vapor deposition method at an average thickness of 1 to 10 μm, and the hard coating layer includes Zr at an atomic ratio of 0.002 to 0.1, and at least one of Y and Ce at an atomic ratio of 0.0005 to 0.05 in a coexistence state.

16 Claims, 2 Drawing Sheets

U.S. PATENT DOCUMENTS

| | | | | |
|---|---|---|---|---|
| 5,656,383 A | * | 8/1997 | Tanaka et al. | 428/699 |
| 5,700,551 A | * | 12/1997 | Kukino et al. | 428/216 |
| 5,730,847 A | * | 3/1998 | Hanaguri et al. | 204/192.38 |
| 6,309,738 B1 | * | 10/2001 | Sakurai | 428/698 |
| 6,395,379 B1 | * | 5/2002 | Braendle | 51/309 |
| 2005/0129986 A1 | * | 6/2005 | Sata et al. | 428/698 |

FOREIGN PATENT DOCUMENTS

| | | | |
|---|---|---|---|
| JP | 07-048666 | | 2/1995 |
| JP | 7-97679 | | 4/1995 |
| JP | 7-205362 | | 8/1995 |
| JP | 07-310174 A | | 11/1995 |
| JP | 08-199338 A | | 8/1996 |
| JP | 08-199341 A | | 8/1996 |
| JP | 09-104966 A | | 4/1997 |
| JP | 09-295204 | * | 11/1997 |
| JP | 09-295204 A | | 11/1997 |
| JP | 9-323205 | | 12/1997 |
| JP | 11--061380 | * | 3/1999 |
| JP | 11-131215 A | | 5/1999 |
| JP | 11-131216 | * | 5/1999 |
| JP | 11-216601 | | 8/1999 |
| JP | 11-310867 | * | 11/1999 |
| JP | 2000-334606 | | 12/2000 |
| JP | 2000-334607 | | 12/2000 |
| JP | 2001-234328 | * | 8/2001 |
| JP | 2001-348661 | | 12/2001 |
| JP | 2004-009162 | | 1/2004 |

OTHER PUBLICATIONS

Japanese Office Action and English translation there of dated Nov. 14, 2006 for corresponding Japanese Application No. 2002-183768.

English Abstract of JP 2004-009162.

* cited by examiner

COATED CUTTING TOOL MEMBER

CROSS-REFERENCE TO PRIOR APPLICATION

This is a U.S. National Phase Application under 35 U.S.C. 0371 of International Patent Application No. PCT/JP2003-007866 filed Jun. 20, 2003, and claims the benefit of Japanese Patent Application Nos. 2002-183768 filed Jun. 25, 2002 and 2002-183772 filed Jun. 25, 2002 both of which are incorporated by reference herein. The International Application was published in Japanse on Dec. 31, 2003 as WO 2004/000494 A1.

TECHNICAL FIELD

The present invention relates to a coated cutting tool member not only exhibiting a superior wear resistance during high speed cutting operations for various kinds of steels and cast irons in which a significant amount of heat is generated, but also exhibiting a superior chipping resistance during a cutting operation for various kinds of steels and cast irons under severe cutting conditions, such as with a large depth of cut or a large feed, due to a hard coating layer thereof having not only a superior high temperature hardness but also a significantly superior high temperature strength.

BACKGROUND ART

Conventionally and in general, cutting tools include an indexable insert which is detachably attached to a tip portion of a cutting tool in order to perform a turning or planing operation for a workpiece such as made of various steels or cast irons, a drill or a micro drill which is used for performing a drilling operation for a workpiece as mentioned above, and a solid type end mill which is used for performing a face milling operation, a groove milling operation, or a shoulder milling operation for a workpiece as mentioned above. In addition, an indexable type end mill is also known, to which an indexable insert is detachably attached to a body for performing a cutting operation as in the case of the solid type end mill.

Moreover, conventionally and in general, as the coated cutting tools as mentioned above, a coated hard metal tool is known in which a hard coating layer, which has an average thickness of 0.5 to 10 µm and is made of, for example, titanium nitride (hereinafter termed TiN), titanium carbonitride (hereinafter termed TiCN), or a nitride compound (hereinafter termed (Ti, Al)N) layer that includes Al and Ti, is formed on a surface of a substrate made of a tungsten carbide (hereinafter termed WC) based cemented carbide, a titanium carbonitride (hereinafter termed TiCN) based cermet, or a cubic boron nitride (hereinafter termed c-BN) based sintered material (hereinafter such a substrate is referred to as a hard substrate). It is also well known that such a coated cutting tool is used in a continuous cutting operation or an interrupted cutting operation for various kinds of steels and cast irons.

As disclosed, for example, in Japanese Unexamined Patent Application, First Publication, No. S62-56565, it is known that the (Ti, Al)N layer as a hard coating layer for the aforementioned coated cutting tool is formed using a physical vapor deposition method in which an arc ion plating apparatus schematically shown in FIG. 2 is used, the inside of the apparatus is heated to a temperature of, for example, 500° C. using a heater, an electric current of, for example, 90A is made to flow as an arc discharge between an anode electrode and a cathode electrode (an evaporation source) to which a Ti—Al alloy piece having a predetermined composition depending on a desired coated layer composition is attached, a nitrogen gas as a reaction gas is simultaneously introduced into the apparatus so as to prepare a reaction atmosphere at, for example, 3 Pa, and on the other hand, a bias voltage of −200 V is applied to the hard substrate.

Among the aforementioned conventional coated cutting tools, a coated cutting tool in which a TiN layer is coated on a surface of a substrate exhibits a superior tool life when it is used for a cutting operation under a normal condition; however, the tool life of the coated cutting tool tends to end in an extremely short period due to excessive wear when it is used for a cutting operation under a high speed condition. Because a coated cutting tool, in which a TiCN layer or a (Ti, Al)N layer is coated, preferably, a (Ti, Al)N layer is coated, exhibits a superior wear resistance even when it is used for a cutting operation under a high speed condition due to an improved high temperature hardness and oxidation resistance of the (Ti, Al)N layer, it is known that the TiCN layer or the (Ti, Al)N layer is now widely used as a hard coating layer for coated cutting tools.

Moreover, in order to further improve the oxidation resistance and high temperature properties of the (Ti, Al)N layer, as disclosed, for example, in Japanese Unexamined Patent Application, First Publications, Nos. H07-310174, H08-199338, H09-295204, and H11-131215, it is known that various (Ti, Al, X)N layers can be formed using a physical vapor deposition method, which include a third metal, such as Si, Y, Zr, V, Nb, or Cr, in the form of replacing Ti and/or Al. Among these layers, it is known that oxidation resistance is significantly improved, in particular, in a nitride compound (hereinafter termed (Ti, Al, Si)N) layer to which Si is added so as to includes Ti, Al, and Si, and which satisfies a composition formula of $(Ti_{1-(x+y)}Al_xSi_y)N_zC_{1-z}$ (where "x" indicates an atomic ratio of 0.05 to 0.75, "y" indicates an atomic ratio of 0.01 to 0.1, and "z" indicates an atomic ratio of 0.6 to 1), or in a nitride compound (hereinafter termed (Ti, Al, Y)N) layer to which Y is added so as to includes Ti, Al, and Y, and which satisfies a composition formula of $(Ti_aAl_bY_c)C_xN_{1-x}$ (where "a" indicates an atomic ratio of 0.3 to 0.7, "b" indicates an atomic ratio of 0.3 to 0.7, "c" indicates an atomic ratio of 0.01 to 2, and "x" indicates an atomic ratio of 0 to 1), and it is also known that a coated cutting tool in which the (Ti, Al, Si)N layer having a significantly improved oxidation resistance is coated exhibits a superior cutting performance than a cutting tool having a (Ti, Al)N layer in a cutting operation, in particular, for a hard steel.

Furthermore, another coated cutting tool has been proposed, in which a hard coating layer, which has an average thickness of 1 to 15 µm and is made of a nitride compound (hereinafter termed (Ti, Al, Zr)N) layer that includes Ti, Al, and Zr and satisfies a composition formula of $(Ti_{1-(X+Y)}Al_XZr_Y)N$ (where X indicates an atomic ratio of 0.45 to 0.65, and Y indicates an atomic ratio of 0.01 to 0.15), is formed on the surface of the aforementioned hard substrate using a physical vapor deposition method. It is also known that such a coated cutting tool is used in a high speed continuous cutting operation or in a high speed interrupted cutting operation for various kinds of steels and cast irons in which a significant amount of heat is generated because the aforementioned (Ti, Al, Zr)N layer forming the hard coating layer has a superior high temperature properties (high temperature hardness, heat resistance, and high temperature strength).

Moreover, it is also known that the aforementioned coated cutting tool is fabricated through a method in which the aforementioned hard substrate is mounted in, for example, an arc ion plating apparatus schematically shown in FIG. 2, which is a type of physical vapor deposition apparatus, an electric current of, for example, 90A is made to flow as an arc discharge between an anode electrode and a cathode electrode (an evaporation source) to which a Ti—Al—Zr alloy piece having a predetermined composition is attached under the conditions in which the inside of the apparatus is heated to a temperature of, for example, 400° C. using a heater, a nitrogen gas as a reaction gas is introduced into the apparatus so as to prepare a reaction atmosphere at, for example, 2 Pa, and on the other hand, a DC bias voltage of −200 V is applied to the aforementioned hard substrate, so that a hard coating layer, which is made of a (Ti, Al, Zr)N layer is formed on the surface of the aforementioned hard substrate.

In recent years, cutting operation apparatuses tend to have significantly high performance, and on the other hand, it is strongly demanded that cutting operations be performed using lower power and less energy at lower cost. Accordingly, a coated cutting tool is strongly demanded, which exhibits not only a superior cutting performance during high speed cutting operations for various kinds of steels and cast irons in which a significant amount of heat is generated, but also a superior cutting performance during a cutting operation for various kinds of steels and cast irons under severe cutting conditions, such as with a large depth of cut or a large feed.

On the other hand, a coated cutting tool in which the aforementioned (Ti, Al)N layer, (Ti, Al, Si)N, or (Ti, Al, Zr)N is coated on a surface of a substrate exhibits a superior wear resistance when it is used for a cutting operation under a high speed condition; however, the cutting tool tends to easily chip and the tool life of the coated cutting tool tends to end in a relatively short period when it is used for high speed cutting operations under severe cutting conditions, such as with a large depth of cut or a large feed.

DISCLOSURE OF INVENTION

In view of the above circumstances, the present inventors have conducted research to develop a coated cutting tool whose hard coating layer exhibits a superior chipping resistance during, in particular, high speed and severe cutting operations by focusing on the hard coating layer included in the aforementioned conventional coated cutting tools, and have obtained the following research results indicated by (a) and (b).

(a) The (Ti, Al, Zr)N layer which is formed, as a conventional hard coating layer, using the arc ion plating apparatus shown in FIG. 2 exhibits strength and toughness, high temperature hardness and heat resistance, and high temperature strength being uniform over the entire thickness of the layer; however, when a (Ti, Al, Zr)N layer is formed using an arc ion plating apparatus whose schematic plan view is shown in FIG. 1A and schematic front view is shown in FIG. 1B, i.e., using an arc ion plating apparatus in which a substrate supporting turntable is provided at the center thereof, a Ti—Al—Zr alloy piece, which corresponds to a Ti—Al—Zr alloy piece that is used for forming the aforementioned conventional (Ti, Al, Zr)N layer as a cathode electrode, and which includes Al at a relatively high ratio, and a Ti—Al—Zr alloy piece, which includes Al at a relatively low ratio, are arranged as cathode electrodes so as to oppose to each other while having the turntable therebetween, under the conditions in which a hard substrate is mounted on the turntable at a position radially away from the center axis of the turntable, the reaction atmosphere in the apparatus is made to be a nitrogen atmosphere, the turntable is rotated while the hard substrate itself is simultaneously rotated about the axis thereof in order to make the hard coating layer, which is formed by vapor deposition, to have a uniform thickness, and an arc discharge is generated between the two cathode electrodes and an anode electrode, because, on the surface of the hard substrate, maximum Al containing points are formed in a layer at moments at which the hard substrate, which is disposed at a position radially away from the center axis of the turntable, is located at a position closest to the cathode electrode of a Ti—Al—Zr alloy piece that includes Al at a relatively high ratio and minimum Al containing points are formed in the layer at moments at which the hard substrate is located at a position closest to the other cathode electrode of a Ti—Al—Zr alloy piece that includes Al at a relatively low ratio, the (Ti, Al, Zr)N layer exhibits a component composition profile in which the maximum Al containing points and the minimum Al containing points appear alternatingly and repeatedly at a predetermined interval in the thickness direction due to the rotation of the turntable, and the amount of contained Al component continuously varies from the maximum Al containing points to the minimum Al containing points and from the minimum Al containing points to the maximum Al containing points.

(b) Regarding the (Ti, Al, Zr)N layer having the repeatedly and continuously changing component composition profile as mentioned in (a), when the amounts of Al and Zr contained in the Ti—Al—Zr alloy piece, which is one of the opposingly arranged cathode electrodes, are adjusted so as to correspond to those of the Ti—Al—Zr alloy piece that is used for forming the aforementioned conventional (Ti, Al, Zr)N layer, the amount of Al component contained in the Ti—Al—Zr alloy piece, which is the other of the opposingly arranged cathode electrodes, is adjusted to be relatively less than that of the Ti—Al—Zr alloy piece that is used for forming the aforementioned conventional (Ti, Al, Zr)N layer, and the rotational speed of the turntable on which the hard substrates are mounted, so that the maximum Al containing points satisfy a composition formula of $(Ti_{1-(X+Y)}Al_XZr_Y)N$ (where X indicates an atomic ratio of 0.45 to 0.65, and Y indicates an atomic ratio of 0.01 to 0.15), the minimum Al containing points satisfy a composition formula of $(Ti_{1-(X+Y)Alx}Zr_Y)N$ (where X indicates an atomic ratio of 0.15 to 0.40, and Y indicates an atomic ratio of 0.01 to 0.15), and a distance between one of the maximum Al containing points and adjacent one of the minimum Al containing points is from 0.01 to 0.1 μm, the maximum Al containing points have properties corresponding to the strength and toughness, high temperature hardness and heat resistance, and high temperature strength of the aforementioned conventional (Ti, Al, Zr)N layer, and on the other hand, the minimum Al containing points exhibit further superior strength and toughness since the minimum Al containing points include less Al and more Ti than the maximum Al containing points. In addition, because the distance between one of the maximum Al containing points and adjacent one of the minimum Al containing points is set to be very small, the entire layer exhibits further superior strength and toughness while ensuring high temperature hardness, heat resistance, and high temperature strength. Accordingly, in the coated cutting tool having a hard coating layer of such a (Ti, Al, Zr)N layer, the hard coating layer exhibits a superior chipping resistance during high speed cutting operations for various kinds of steels and cast irons under severe cutting conditions, such as with a large depth of cut or a large feed, in which large mechanical impacts occur.

The present invention was conceived in view of the aforementioned research results, and provides a coated cutting tool member whose hard coating layer exhibits a superior chipping resistance under high speed and severe cutting conditions. The coated cutting tool member includes: a hard substrate; and a hard coating layer of an (Ti, Al, Zr)N, which is formed on a surface of the hard substrate using a physical vapor deposition method at an overall average thickness of 1 to 15 µm, wherein the hard coating layer has a component composition profile in which maximum Al containing points and minimum Al containing points appear alternatingly and repeatedly at a predetermined interval in a direction of thickness of the hard coating layer, and the amount of contained Al component continuously varies from the maximum Al containing points to the minimum Al containing points and from the minimum Al containing points to the maximum Al containing points, the maximum Al containing points satisfy a composition formula of $(Ti_{1-(X+Y)}Al_XZr_Y)N$ (where X indicates an atomic ratio of 0.45 to 0.65, and Y indicates an atomic ratio of 0.01 to 0.15), the minimum Al containing points satisfy a composition formula of $(Ti_{1-(X+Y)}Al_XZr_Y)N$ (where X indicates an atomic ratio of 0.15 to 0.40, and Y indicates an atomic ratio of 0.01 to 0.15), and a distance between one of the maximum Al containing points and an adjacent one of the minimum Al containing points is from 0.01 to 0.1 µm.

The present invention also provides a method for forming a hard coating layer exhibiting a superior wear resistance during high speed cutting operations on a surface of a hard substrate. The method includes: mounting the hard substrate of a WC based cemented carbide and/or a TiCN based cermet and/or a c-BN based sintered material on a turntable housed in an arc ion plating apparatus at a position radially away from a center axis of the turntable in a manner rotatable about an axis of the hard substrate; producing a nitrogen gas atmosphere as the reaction atmosphere in the arc ion plating apparatus; and generating arc discharge between a cathode electrode of a Ti—Al—Zr alloy piece for forming maximum Al containing points and an anode electrode, and between another cathode electrode of a Ti—Al—Zr alloy piece for forming minimum Al containing points, which is disposed so as to oppose the other cathode electrode with respect to the turntable, and another anode electrode, so that a hard coating layer having overall average thickness of 1 to 15 µm is formed, by a physical vapor deposition method, on the surface of the hard substrate being turned while rotating on the turntable about an axis of the hard substrate, wherein the hard coating layer has a component composition profile in which the maximum Al containing points and the minimum Al containing points appear alternatingly and repeatedly at a predetermined interval in a direction of thickness of the hard coating layer, and the amount of contained Al component continuously varies from the maximum Al containing points to the minimum Al containing points and from the minimum Al containing points to the maximum Al containing points, the maximum Al containing points satisfy a composition formula of $(Ti_{1-(X+Y)}Al_XZr_Y)N$ (where X indicates an atomic ratio of 0.45 to 0.65, and Y indicates an atomic ratio of 0.01 to 0.15), the minimum Al containing points satisfy a composition formula of $(Ti_{1-(X+Y)}Al_XZr_Y)N$ (where X indicates an atomic ratio of 0.15 to 0.40, and Y indicates an atomic ratio of 0.01 to 0.15), and a distance between one of the maximum Al containing points and adjacent one of the minimum Al containing points is from 0.01 to 0.1 µm.

Next, the reason the structure of the hard coating layer of the present invention was limited as described above will be explained below.

(A) Composition of the Maximum Al Containing Points

Ti component contained in the (Ti, Al, Zr)N layer of the maximum Al containing points improves strength and toughness, and Al component improves high temperature hardness and heat resistance; therefore, the high temperature hardness and heat resistance are improved as the contained Al component is increased, and the coated cutting tool becomes more suitable for high speed cutting operations in which a significant amount of heat is generated; however, when the X value indicating the ratio (atomic ratio) of the Al component in the total amount of the Al, Ti, and Zr components is greater than 0.65, reduction in the strength and toughness of the layer is inevitable even though the minimum Al containing points having high strength and high toughness exist adjacent thereto, which makes the cutting tool to easily chip. On the other hand, when the X value is less than 0.45, it is difficult to ensure desired high temperature hardness and heat resistance. Accordingly, the X value was set from 0.45 to 0.65.

Moreover, Zr component improves high temperature strength. When the Y value indicating the ratio (atomic ratio) of the Zr component to the total amount of the Al, Ti, and Zr components is less than 0.01, the high temperature strength is not desirably improved, and when the Y value is greater than 0.15, the high temperature hardness and heat resistance tend to decrease. Accordingly, the Y value was set from 0.01 to 0.15.

(B) Composition of the Minimum Al Containing Points

As explained above, the maximum Al containing points exhibit desired high temperature hardness, heat resistance, and high temperature strength; however, in contrast, exhibit insufficient strength and toughness for high speed cutting operations under severe cutting conditions, such as with a large depth of cut or a large feed, in which large mechanical impacts occur; therefore, in order to improve the strength and toughness of the maximum Al containing points, the minimum Al containing points, which include Ti at a high ratio and Al at a low ratio and thus exhibit high toughness, are alternatingly interposed in the thickness direction. Accordingly, when the X value indicating the ratio (atomic ratio) of the Al component to the total amount of the Al, Ti, and Zr components is greater than 0.40, desired superior strength and toughness cannot be ensured, and on the other hand, when the X value is less than 0.15, desired high temperature hardness and heat resistance cannot be ensured, which accelerates wear of the layer even though the maximum Al containing points having superior high temperature hardness and heat resistance exist adjacent thereto. Accordingly, the X value indicating the ratio of the Al component in the minimum Al containing points was set from 0.15 to 0.40.

Furthermore, Zr component is included in the minimum Al containing points in order to improve high temperature strength so that the cutting tool becomes suitable for high speed cutting operations in which a significant amount of heat is generated, as explained above. When the Y value is less than 0.01, high temperature strength is not desirably improved, and when the Y value is greater than 0.15, the high temperature hardness and heat resistance tend to decrease, which leads to accelerated wear. Accordingly, the Y value was set from 0.01 to 0.15.

(C) Distance Between the Maximum Al Containing Point and the Minimum Al Containing Point The distance between the maximum Al containing point and the minimum Al containing point was set from 0.01 to 0.1 μm because when the distance is less than 0.01 μm, it is difficult to form each of the points so as to have the aforementioned composition, and thus it is difficult to ensure further superior strength and toughness while ensuring desired high temperature hardness, heat resistance, and high temperature strength in the layer, and when the distance is greater than 0.1 μm, weaknesses at each of the points exhibited during high speed cutting operations under severe cutting conditions, i.e., insufficient strength and toughness in the case of the maximum Al containing point, and insufficient high temperature hardness and heat resistance in the case of the minimum Al containing point, will locally appear in the layer, which may lead to chipping in the cutting edge or excessive wear.

(D) Overall Average Thickness of the Hard Coating Layer

The average thickness was set from 1 to 15 μm because when the thickness of the layer is less than 1 μm, a desired wear resistance cannot be ensured, and in contrast, when the average thickness is greater than 15 μm, the cutting edge tends to be chipped.

Furthermore, the present inventors have conducted research to develop a coated cutting tool whose hard coating layer has superior high temperature hardness and high temperature strength, and which exhibits a superior wear resistance and chipping resistance during, in particular, high speed and severe cutting operations, and have obtained the following research results indicated by (c) to (f).

(c) When a hard coating layer is formed with a nitride compound (hereinafter termed (Ti, Al, Zr, M)N) layer that includes Ti, Al, Zr, and at least one selected from Y and Ce, and satisfies a composition formula of $(Ti_{1-(a+b+c)}Al_aZr_bM_c)N$ (where M indicates at least one of Y and Ce, and among the composition ratios for the elements, "a" indicates an atomic ratio of 0.05 to 0.6, "b" indicates an atomic ratio of 0.002 to 0.1, and "c" indicates an atomic ratio of 0.0005 to 0.05) by adding Zr as an essential element and at least one of Y and Ce as a optional element to the (Ti, Al)N layer forming the hard coating layer of the aforementioned conventional coated cutting tool, the (Ti, Al, Zr, M)N layer in the obtained coated cutting tool exhibits not only superior oxidation resistance, but also further superior high temperature hardness when compared with the (Ti, Al)N layer or a (Ti, Al, Si)N layer, and thus the coated cutting tool whose hard coating layer is of the (Ti, Al, Zr, M)N layer having such a composition exhibits a further superior wear resistance during high speed cutting operations for various kinds of steels and cast irons.

(d) The (Ti, Al, Si)N layer and the (Ti, Al, Y)N layer exhibit an improved oxidation resistance due to indirect improvement in the oxidation resistance such that diffusion of oxygen is restrained since an oxidized layer formed on a coated surface by oxidation of the coated surface is thermally stable and compact; however, in contrast, the (Ti, Al, Zr, M)N layer exhibits an improved oxidation resistance due to a direct improvement in the oxidation resistance such that both the coating layer and the coated surface tend not to be easily oxidized, in other words, the surface portion is maintained in long term in a steady state in which hardness and oxidation resistance are ensured.

(e) It is also possible to obtain superior oxidation resistance and extremely superior high temperature hardness, as in the aforementioned (Ti, Al, Zr, M)N layer in which nitride compounds are used, by using carbonitride compounds for the hard coating layer; however, in such a case, an atomic ratio of nitrogen must be greater than or equal to 60%, i.e., the layer must satisfy a composition formula of $(Ti_{1-(a+b+c)}Al_aZr_bM_c)N_{1-d}C_d$ (where, among the composition ratios for the elements, "a" indicates an atomic ratio of 0.05 to 0.60, "b" indicates an atomic ratio of 0.002 to 0.1, "c" indicates an atomic ratio of 0.0005 to 0.05, and "d" indicates an atomic ratio of 0 to 0.4), in order to, at least, ensure oxidation resistance required for interrupted cutting operations.

(f) The hard coating layer, in which the entire layer further superior strength and toughness while ensuring high temperature hardness, heat resistance, and high temperature strength due to the component composition profile as mentioned in (a), can also be formed by using Zr at an atomic ratio of 0.002 to 0.1, at least one of Y and Ce at an atomic ratio of 0.0005 to 0.05. With regard to formation of the (Ti, Al, Zr, M)N layer (where M indicates at least one of Y and Ce) having the aforementioned component composition profile, when the amount of Al contained in the Ti—Al—Zr-M alloy piece, which is one of the oppositely arranged cathode electrodes, is set to be relatively high, the amount of Al contained in the Ti—Al—Zr-M alloy piece, which is the other of the oppositely arranged cathode electrodes, is set to be relatively low, and the rotational speed of the turntable on which the hard substrates are mounted, so that the maximum Al containing points satisfy a composition formula of $(Ti_{1-(a+b+c)}Al_aZr_bM_c)N$ (where, among the composition ratios for the elements, "a" indicates an atomic ratio of 0.40 to 0.60, "b" indicates an atomic ratio of 0.002 to 0.1, and "c" indicates an atomic ratio of 0.0005 to 0.05), the minimum Al containing points satisfy a composition formula of $(Ti_{1-(a+b+c)}Al_aZr_bM_c)N$ (where, among the composition ratios for the elements, "a" indicates an atomic ratio of 0.05 to 0.25, "b" indicates an atomic ratio of 0.002 to 0.1, and "c" indicates an atomic ratio of 0.0005 to 0.05), and a distance between one of the maximum Al containing points and adjacent one of the minimum Al containing points is from 0.01 to 0.1 μm, the maximum Al containing points exhibit superior high temperature hardness and heat resistance, and on the other hand, the minimum Al containing points exhibit further superior strength and toughness. In addition, because the distance between one of the maximum Al containing points and adjacent one of the minimum Al containing points is set to be very small, the entire layer exhibits superior strength and toughness while ensuring high temperature hardness and oxidation resistance. Accordingly, in the coated cutting tool having a hard coating layer of such a (Ti, Al, Zr, M)N layer, the hard coating layer exhibits a superior wear resistance and chipping resistance during high speed and severe cutting operations for various kinds of steels and cast irons.

The present invention was conceived in view of the aforementioned research results, and provides a coated cutting tool whose hard coating layer has an extremely high coating hardness and exhibits superior wear resistance, as well as superior chipping resistance during cutting operations under high speed and severe cutting conditions. The coated cutting tool includes: a hard substrate; and a hard coating layer of an (Ti, Al, Zr, M)N which is formed on a surface of the hard substrate using a physical vapor deposition method at an overall average thickness of 1 to 10 μm, and whose composition formula is expressed by $(Ti_{1-(a+b+c)}Al_aZr_bM_c)N$ (where M indicates at least one of Y and Ce, and among the composition ratios for the elements, "a" indicates an atomic ratio of 0.05 to 0.60, "b" indicates an atomic ratio of 0.002 to 0.1, and "c" indicates an atomic ratio of 0.0005 to 0.05), wherein the hard coating layer has a component composition profile in which maximum Al containing points and minimum Al containing points appear alternatingly and repeatedly at a predetermined interval in a direction of thickness of the hard coating layer, and the amount of contained Al component continuously varies from the maximum Al containing points to the minimum Al containing points and from the minimum Al containing points to the maximum Al containing points, the maximum Al containing points satisfy a composition formula of $(Ti_{1-(a+b+c)}Al_aZr_bM_c)N$ (where, among the composition ratios for the elements, "a" indicates an atomic ratio of 0.40 to 0.60, "b" indicates an atomic ratio of 0.002 to 0.1, and "c" indicates an atomic ratio of 0.0005 to 0.05), the minimum Al containing points satisfy a composition formula of $(Ti_{1-(a+b+c)}Al_aZr_bM_c)N$ (where, among the composition ratios for the elements, "a" indicates an atomic ratio of 0.05 to 0.25, "b" indicates an atomic ratio of 0.002 to 0.1, and "c" indicates an atomic ratio of 0.0005 to 0.05), and a distance between one of the maximum Al containing points and an adjacent one of the minimum Al containing points is from 0.01 to 0.1 µM.

Next, the reason the structure of the hard coating layer of the present invention was limited as described above will be explained below.

(E) In the (Ti, Al, Zr, M)N layer, Ti component and Al component as primary composition components in a coexistence state with each other contribute to enhancing high temperature hardness and oxidation resistance of the coating layer; however, when the Al component in the coating layer is less than 0.30, both high temperature hardness and oxidation resistance tend to decrease. In this case, superior high temperature hardness can be obtained by adding Y component and/or Ce component in a coexistence state, and decrease in oxidation resistance can be prevented by adding Zr component in a coexistence state. However, when the Al component in the coating layer is less than 0.05, although high temperature hardness can be maintained by coexistence of Y component and/or Ce component, desired oxidation resistance cannot be ensured even with the Zr component in a coexistence state. On the other hand, when the Al component in the coating layer is more than 0.60, density of grain boundary in the coating composition becomes excessively high due to coexistence effects of the Y component and/or Ce component, and oxidation rapidly progresses in an intergranular region; therefore, the ratio of the Al component is set from 0.05 to 0.60, and preferably, from 0.30 to 0.50.

Moreover, Zr component, which is also a composition component, prevents oxidation of the coating layer in a coexistence state at a ratio depending on the composition ratio of the Al component, so that degradation of properties of the surface of the hard coating due to oxidation is prevented, and superior wear resistance is maintained for a long term; however, when the Zr component is less than 0.002, oxidation resistance cannot be desirably improved. On the other hand, because nitride compound of Zr itself does not have superior high temperature hardness, when the Zr component is more than 0.1 in an atomic ratio with respect to the entire metal components, high temperature hardness of the layer tends to decrease, and it is difficult to ensure high temperature hardness that is required during high speed cutting operations. Accordingly, the ratio of the Zr component is set from 0.002 to 0.1, and preferably, from 0.005 to 0.05.

Furthermore, Y component and/or Ce component, which are also a composition component, is added in order to enhance high temperature hardness of the (Ti, Al, Zr)N layer in a coexistence state with the Ti component and Al component at a predetermined ratio; however, when the Y component and/or Ce component are less than 0.0005, high temperature hardness cannot be desirably improved. On the other hand, because nitride compound of Y and/or Ce itself does not have superior high temperature hardness, when the Y component and/or Ce component are more than 0.05 in an atomic ratio with respect to the entire metal components, high temperature hardness of the (Ti, Al, Zr, M)N layer tends to decrease, and it is difficult to ensure high temperature hardness that is required during high speed cutting operations, which leads to accelerated wear of the cutting tool. Accordingly, the ratio of the Y component and/or Ce component is set from 0.0005 to 0.05, and preferably, from 0.001 to 0.02.

(F) Composition of the Maximum Al Containing Points

Ti component contained in the (Ti, Al, Zr, M)N layer of the maximum Al containing points improves strength and toughness, and Al component improves high temperature hardness and oxidation resistance of the coating layer in a coexistence state with the Ti component; therefore, the high temperature hardness and oxidation resistance are improved as the contained Al component is increased, and the coated cutting tool becomes more suitable for high speed and severe cutting operations in which a significant amount of heat is generated; however, as explained above, when the "a" value indicating the ratio (atomic ratio) of the Al component in the total amount of the metal elements is greater than 0.60, density of grain boundary in the coating composition becomes excessively high due to coexistence effects of the Y component and/or Ce component, and oxidation rapidly progresses in an intergranular region. On the other hand, the maximum Al containing points should be given extremely superior high temperature hardness and oxidation resistance in consideration of coexistence with the minimum Al containing points which have high strength and high toughness but have relatively inferior high temperature hardness and oxidation resistance. Accordingly, the "a" value was set from 0.40 to 0.60.

(G) Composition of the Minimum Al Containing Points

As explained above, the maximum Al containing points exhibit desired high temperature hardness and oxidation resistance; however, in contrast, exhibit insufficient strength and toughness for cutting operations under severe cutting conditions, such as with a large depth of cut or a large feed, in which large mechanical impacts occur; therefore, in order to improve the strength and toughness of the maximum Al containing points, the minimum Al containing points, which include Ti at a high ratio and Al at a low ratio and thus exhibit high toughness, are alternatingly interposed in the thickness direction. Accordingly, when the "a" value indicating the ratio (atomic ratio) of the metal elements is greater than 0.25, desired superior strength and toughness cannot be ensured, and on the other hand, when the "a" value is less than 0.05, high temperature hardness and oxidation resistance are significantly reduced even in a coexistence state with the Zr component and the Y component and/or Ce component, which accelerates wear of the layer even though the maximum Al containing points having superior high temperature hardness and oxidation resistance exist adjacent thereto. Accordingly, the "a" value indicating the ratio of the Al component in the minimum Al containing points was set from 0.05 to 0.25.

(H) Distance Between the Maximum Al Containing Point and the Minimum Al Containing Point The distance between the maximum Al containing point and the minimum Al containing point was set from 0.01 to 0.1 µm because when the distance is less than 0.01 µm, it is difficult to form each of the points so as to have the aforementioned composition, and thus it is difficult to ensure further superior strength and toughness while ensuring desired high temperature hardness and oxidation resistance in the layer, and when the distance is greater than 0.1 µm, weaknesses at each of the points exhibited during high speed cutting operations under severe cutting conditions, i.e., insufficient strength and toughness in the case of the maximum Al containing point, and insufficient oxidation resistance and high temperature hardness in the case of the minimum Al containing point, will locally appear in the layer, which may lead to chipping in the cutting edge or excessive wear.

(I) Overall Average Thickness of the Hard Coating Layer

The average thickness was set from 1 to 10 µm because when the thickness of the layer is less than 1 µm, a desired wear resistance cannot be ensured, and in contrast, when the average thickness is greater than 10 µm, the cutting edge tends to be chipped.

BRIEF DESCRIPTION OF THE DRAWINGS

FIG. 1A is a schematic plan view, and FIG. 1B is a schematic front view.

BEST MODE FOR CARRYING OUT THE INVENTION

Next, the coated cutting tools of the present invention will be explained in detail with Examples.

EXAMPLE 1

First, ingredient powders, i.e., powders of WC, TiC, VC, TaC, NbC, Cr$_3$C$_2$, and Co, all of which have an average grain size in a range from 1 to 3 µm, were prepared and mixed in accordance with blending ratios shown in TABLE 1. The ingredient powders were mixed under wet conditions using a ball mill for 48 hours, were dried, and were compacted under pressure of 100 MPa so as to form green compacts. The green compacts were held in a vacuum of 6 Pa at a temperature of 1420° C. for 1 hour so as to be sintered. After sintering, a honing process, in which a radius is set to be 0.03, is applied to cutting edge portions of each of the sintered compacts so as to obtain hard substrates A-1 to A-10 of WC based hard metal, each of which had an insert shape defined as CNMG120412 in the ISO standard.

Furthermore, ingredient powders, i.e., powders of TiCN (TiC/TiN=50/50 when expressed by weight ratio), Mo$_2$C, ZrC, NbC, TaC, WC, Co, and Ni, all of which had an average grain size in a range from 0.5 to 2 µm, were prepared and mixed in accordance with blending ratios shown in TABLE 2. The ingredient powders were mixed under wet conditions using a ball mill for 72 hours, were dried, and were compacted under pressure of 100 MPa so as to form green compacts. The green compacts were held in a vacuum of 6 Pa at a temperature of 1520° C. for 1 hour so as to be sintered. After sintering, a honing process, in which a radius is set to be 0.03, is applied to cutting edge portions of each of the sintered compacts so as to obtain hard substrates B-1 to B-6 of TiCN cermet, each of which had an insert shape defined as CNMG120412 in the ISO standard.

Figure 1A:
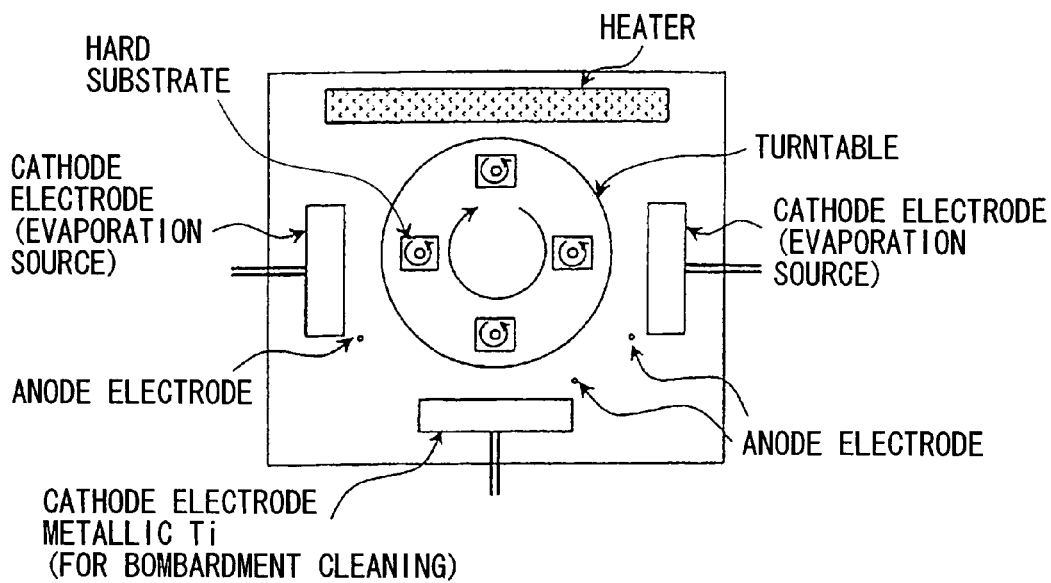
FIGS. 1A and 1B show an arc ion plating apparatus that is used for forming a hard coating layer included in a coated cutting tool of the present invention, in particular.
Figure 1B:
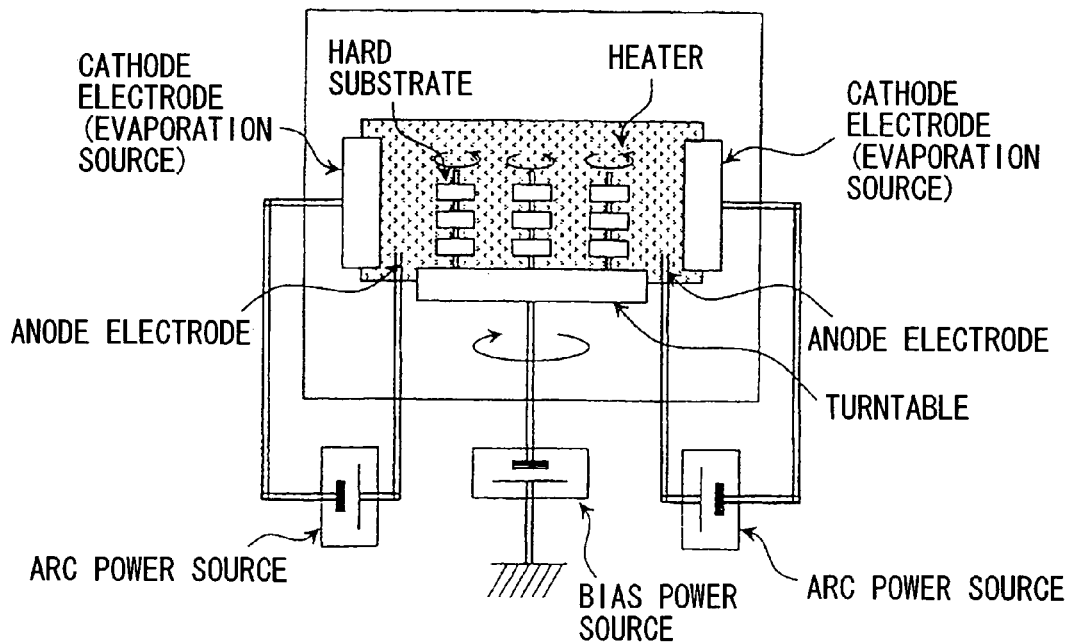

Next, the aforementioned hard substrates A-1 to A-10 and B-1 to B-6 were subjected to ultrasonic cleaning in an acetone solvent, were dried, and were mounted on a turntable housed in an arc ion plating apparatus shown in FIGS. 1A and 1B at positions along the inner circumference of the turntable. In the arc ion plating apparatus, a Ti—Al—Zr alloy piece having various compositions for forming maximum Al containing points was set as a cathode electrode (evaporation source), a Ti—Al—Zr alloy piece having various compositions for forming minimum Al containing points was set as another cathode electrode (evaporation source) so as to oppose to the other cathode electrode while having the turntable therebetween, and a metallic Ti piece for bombardment cleaning was also set. The inside of the apparatus was evacuated and was held at a vacuum at a pressure of 0.5 Pa or less, and the inside of the apparatus was heated to a temperature of 500° C. using a heater. Then, a DC bias voltage of −1000 V was applied to the hard substrates which are turned while rotating on the turntable about the respective axes thereof, and an electric current of 100A was made to flow as an arc discharge between the cathode electrode, i.e., the metallic Ti piece, and an anode electrode, so that the surfaces of the hard substrates were subjected to Ti bombardment cleaning. Next, a nitrogen gas, as a reaction gas, was introduced into the apparatus so as to prepare a reaction atmosphere at a pressure of 3 Pa, a DC bias voltage of −30 V was applied to the hard substrates which are turned while rotating on the turntable about the respective axes thereof, and an electric current of 150A was made to flow as an arc discharge between the cathode electrodes (the Ti—Al—Zr alloy piece for forming the maximum Al containing points and the Ti—Al—Zr alloy piece for forming the minimum Al containing points) and the anode electrodes, respectively, so that a hard coating layer, which had component composition profile in which the maximum Al containing points and the minimum Al containing points having a designated composition shown in TABLES 3 and 4 appear alternatingly and repeatedly at a designated interval also shown in TABLES 3 and 4 in the thickness direction, and the amount of contained Al component continuously varies from the maximum Al containing points to the minimum Al containing points and from the minimum Al containing points to the maximum Al containing points, and which had a designated overall layer thickness also shown in TABLES 3 and 4, was formed, by a vapor deposition method, on the surface of each of the hard substrates, and thereby surface-coated hard metal inserts 1A to 10A and 1B to 6B of the present invention (hereinafter referred to as coated inserts of the present invention), as the coated cutting tools of the present invention, were fabricated.

Figure 2:
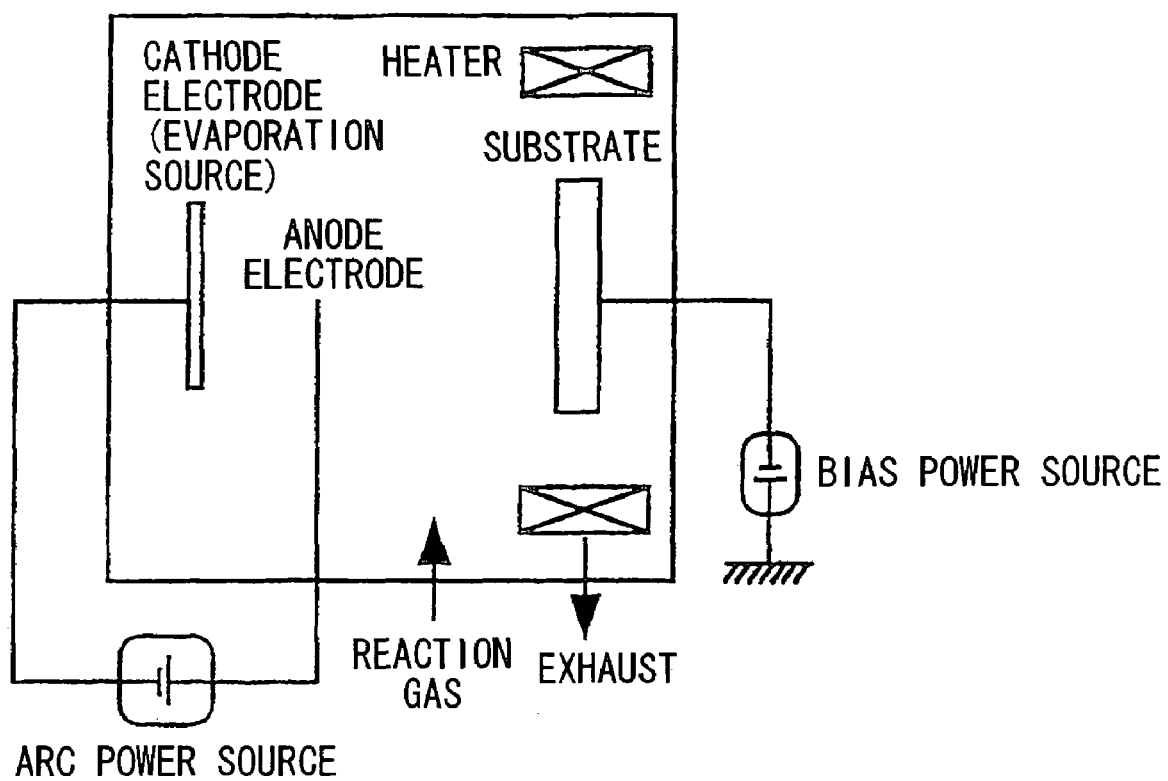
FIG. 2 is a schematic diagram showing a normal arc ion plating apparatus that is used for forming a hard coating layer included in a conventional coated cutting tool.

For the purpose of comparison, the hard substrates A-1 to A-10 and B-1 to B-6 were subjected to ultrasonic cleaning in acetone, were dried, and were mounted in a conventional arc ion plating apparatus shown in FIG. 2. In the arc ion plating apparatus, a Ti—Al—Zr alloy piece having various compositions was set as a cathode electrode (evaporation source), a metallic Ti piece for bombardment cleaning was also set, the inside of the apparatus was evacuated and was held at a vacuum at a pressure of 0.5 Pa or less, and the inside of the apparatus was heated to a temperature of 400° C. using a heater. Then, a DC bias voltage of −1000 V was applied to the hard substrates, and an electric current of 90A was made to flow as an arc discharge between the cathode electrode, i.e., the metallic Ti piece, and an anode electrode, so that the surfaces of the hard substrates were subjected to Ti bombardment cleaning. Next, a nitrogen gas, as a reaction gas, was introduced into the apparatus so as to prepare a reaction atmosphere at a pressure of 2 Pa, the bias voltage applied to the hard substrates was decreased to −200 V, and an electric current was made to flow as an arc discharge between the cathode electrode and the anode electrode so that a hard coating layer, which had a designated composition and a designated layer thickness shown in TABLES 5 and 6, and which included a (Ti, Al, Zr)N layer in which composition was substantially constant in the direction of the layer thickness, was formed, by a vapor deposition method, on the surface of each of the hard substrates A-1 to A-10 and B-1 to B-6, and thereby conventional surface-coated hard metal inserts 1a to 10a and 1b to 6b (hereinafter referred to as conventional coated inserts), as conventional coated cutting tools, were fabricated.

Next, the coated inserts 1A to 10A and 1B to 6B of the present invention and the conventional coated inserts 1a to 10a and 1b to 6b were subjected to cutting tests by attaching each of them to a tip portion of a cutting tool made of tool steel using a fixing bridge and a screw. The detailed test conditions were set as follows:

with regard to high-speed, dry, and continuous cutting tests with a large depth of cut in which workpieces of alloy steel were machined, workpiece: a round bar of SNCM439 defined in the JIS,
cutting speed: 300 m/min,
depth of cut: 5.5 mm,
feed: 0.15 mm/rev,
time: 5 min;

with regard to high-speed, dry, and interrupted cutting tests with a large feed in which workpieces of alloy steel were machined, workpiece: a round bar with four evenly distributed longitudinal grooves made of SCM440 defined in the JIS,
cutting speed: 300 m/min,
depth of cut: 1.6 mm,
feed: 0.5 mm/rev,
time: 5 min; and with regard to high-speed, dry, and continuous cutting tests with a large depth of cut in which workpieces of cast iron were machined, workpiece: a round bar made of FC300 defined in the JIS,
cutting speed: 320 m/min,
depth of cut: 5.5 mm,
feed: 0.15 mm/rev,
time: 5 min.

In each of the cutting tests, flank wear width of the cutting edge was measured. The test results are shown in TABLE 7.

TABLE 1

| Classification | | Blending ratio (wt %) | | | | | | |
|---|---|---|---|---|---|---|---|---|
| | | Co | TiC | TaC | NbC | VC | $Cr_3C_2$ | WC |
| Substrate (Insert) | A-1 | 5.5 | — | — | — | — | 0.3 | Balance |
| | A-2 | 6.5 | — | 1 | — | — | — | Balance |
| | A-3 | 7 | — | — | — | — | 0.4 | Balance |
| | A-4 | 7.5 | 2 | — | 1 | — | — | Balance |
| | A-5 | 8.5 | — | — | — | 0.3 | 0.3 | Balance |
| | A-6 | 9 | 6 | — | 4 | — | — | Balance |
| | A-7 | 10 | — | 1 | — | — | 0.5 | Balance |
| | A-8 | 11 | 5 | — | 7 | — | 0.5 | Balance |
| | A-9 | 12.5 | — | — | — | 1.5 | 0.8 | Balance |
| | A-10 | 11.5 | 10 | — | 8 | — | — | Balance |

TABLE 2

| Classification | | Blending ratio (wt %) | | | | | | | |
|---|---|---|---|---|---|---|---|---|---|
| | | Co | Ni | ZrC | TaC | NbC | $MO_2C$ | WC | TiCN |
| Substrate (Insert) | B-1 | 15 | 5 | — | 10 | — | 10 | 16 | Balance |
| | B-2 | 8 | 7 | — | 5 | — | 7.5 | — | Balance |
| | B-3 | 7 | 2 | — | — | — | 6 | 10 | Balance |
| | B-4 | 13 | 7 | — | 11 | 2 | — | — | Balance |
| | B-5 | 9 | 6 | 1 | 8 | — | 10 | 10 | Balance |
| | B-6 | 14 | 5 | — | 10 | — | 9.5 | 14.5 | Balance |

TABLE 3

| Classification | Symbols of substrate | Hard coating layer | | | | | | | | Designated distance between two points (μm) | Designated overall layer thickness (μm) |
|---|---|---|---|---|---|---|---|---|---|---|---|
| | | Minimum Al containing points Designated composition (atomic ratio) | | | | Minimum Al containing points Designated composition (atomic ratio) | | | | | |
| | | Ti | Al | Zr | N | Ti | Al | Zr | N | | |
| Coated insert of the present invention | 1A A-1 | 0.45 | 0.45 | 0.10 | 1.00 | 0.60 | 0.30 | 0.10 | 1.00 | 0.01 | 5 |
| | 2A A-2 | 0.35 | 0.50 | 0.15 | 1.00 | 0.74 | 0.25 | 0.01 | 1.00 | 0.03 | 9 |
| | 3A A-3 | 0.40 | 0.55 | 0.05 | 1.00 | 0.75 | 0.20 | 0.15 | 1.00 | 0.05 | 1 |
| | 4A A-4 | 0.30 | 0.60 | 0.10 | 1.00 | 0.80 | 0.15 | 0.05 | 1.00 | 0.07 | 11 |
| | 5A A-5 | 0.34 | 0.65 | 0.01 | 1.00 | 0.70 | 0.20 | 0.10 | 1.00 | 0.09 | 6 |
| | 6A A-6 | 0.50 | 0.45 | 0.05 | 1.00 | 0.64 | 0.35 | 0.01 | 1.00 | 0.02 | 13 |
| | 7A A-7 | 0.40 | 0.50 | 0.10 | 1.00 | 0.45 | 0.40 | 0.15 | 1.00 | 0.04 | 3 |
| | 8A A-8 | 0.30 | 0.55 | 0.15 | 1.00 | 0.70 | 0.25 | 0.05 | 1.00 | 0.06 | 15 |
| | 9A A-9 | 0.39 | 0.60 | 0.01 | 1.00 | 0.75 | 0.15 | 0.10 | 1.00 | 0.08 | 4 |
| | 10A A-10 | 0.30 | 0.65 | 0.05 | 1.00 | 0.65 | 0.30 | 0.05 | 1.00 | 0.10 | 7 |

TABLE 4

| Classification | Symbols of substrate | Hard coating layer | | | | | | | | Designated distance between two points (μm) | Designated overall layer thickness (μm) |
|---|---|---|---|---|---|---|---|---|---|---|---|
| | | Maximum Al containing points Designated composition (atomic ratio) | | | | Minimum Al containing points Designated composition (atomic ratio) | | | | | |
| | | Ti | Al | Zr | N | Ti | Al | Zr | N | | |
| Coated insert of the | 1B B-1 | 0.44 | 0.55 | 0.01 | 1.00 | 0.59 | 0.40 | 0.01 | 1.00 | 0.01 | 15 |
| | 2B B-2 | 0.30 | 0.65 | 0.05 | 1.00 | 0.75 | 0.15 | 0.10 | 1.00 | 0.02 | 8 |
| | 3B B-3 | 0.45 | 0.45 | 0.10 | 1.00 | 0.65 | 0.30 | 0.05 | 1.00 | 0.04 | 6 |

TABLE 4-continued

| | | | Hard coating layer | | | | | | | | | |
|---|---|---|---|---|---|---|---|---|---|---|---|---|
| | | | Maximum Al containing points Designated composition (atomic ratio) | | | | Minimum Al containing points Designated composition (atomic ratio) | | | | Designated distance between two points | Designated overall layer thickness |
| Classification | | Symbols of substrate | Ti | Al | Zr | N | Ti | Al | Zr | N | (µm) | (µm) |
| present invention | 4B | B-4 | 0.35 | 0.50 | 0.15 | 1.00 | 0.65 | 0.25 | 0.10 | 1.00 | 0.06 | 10 |
| | 5B | B-5 | 0.30 | 0.60 | 0.10 | 1.00 | 0.65 | 0.20 | 0.15 | 1.00 | 0.08 | 1 |
| | 6B | B-6 | 0.40 | 0.55 | 0.05 | 1.00 | 0.60 | 0.35 | 0.05 | 1.00 | 0.10 | 4 |

TABLE 5

| | | | Hard coating layer | | | | |
|---|---|---|---|---|---|---|---|
| | | Symbols of | Designated composition (atomic ratio) | | | | Designated layer thickness |
| Classification | | substrate | Ti | Al | Zr | N | (µm) |
| Conventional coated insert | 1a | A-1 | 0.45 | 0.45 | 0.10 | 1.00 | 5 |
| | 2a | A-2 | 0.35 | 0.50 | 0.15 | 1.00 | 9 |
| | 3a | A-3 | 0.40 | 0.55 | 0.05 | 1.00 | 1 |
| | 4a | A-4 | 0.30 | 0.60 | 0.10 | 1.00 | 11 |
| | 5a | A-5 | 0.34 | 0.65 | 0.01 | 1.00 | 6 |
| | 6a | A-6 | 0.50 | 0.45 | 0.05 | 1.00 | 13 |
| | 7a | A-7 | 0.40 | 0.50 | 0.10 | 1.00 | 3 |
| | 8a | A-8 | 0.30 | 0.55 | 0.15 | 1.00 | 15 |
| | 9a | A-9 | 0.39 | 0.60 | 0.01 | 1.00 | 4 |
| | 10a | A-10 | 0.30 | 0.65 | 0.05 | 1.00 | 7 |

TABLE 6

| | | | Hard coating layer | | | | |
|---|---|---|---|---|---|---|---|
| | | Symbols of | Designated composition (atomic ratio) | | | | Designated layer thickness |
| Classification | | substrate | Ti | Al | Zr | N | (µm) |
| Conventional coated insert | 1b | B-1 | 0.44 | 0.55 | 0.01 | 1.00 | 15 |
| | 2b | B-2 | 0.30 | 0.65 | 0.05 | 1.00 | 8 |
| | 3b | B-3 | 0.45 | 0.45 | 0.10 | 1.00 | 6 |
| | 4b | B-4 | 0.35 | 0.50 | 0.15 | 1.00 | 10 |
| | 5b | B-5 | 0.30 | 0.60 | 0.10 | 1.00 | 1 |
| | 6b | B-6 | 0.40 | 0.55 | 0.05 | 1.00 | 4 |

TABLE 7

| | | Flank wear width (mm) | | | | Results of cutting tests | | |
|---|---|---|---|---|---|---|---|---|
| Classification | | High speed and continuous cutting of alloy steel with large depth of cut | High speed and interrupted cutting of alloy steel with large feed | High speed and continuous cutting of cast iron with large depth of cut | Classification | High speed and continuous cutting of alloy steel with large depth of cut | High speed and interrupted cutting of alloy steel with large feed | High speed and continuous cutting of cast iron with large depth of cut |
| Coated insert of the invention | 1A | 0.23 | 0.19 | 0.18 | Conv. coated insert | 1a | The end of tool life at 2.9 minutes | The end of tool life at 2.7 minutes | The end of tool life at 3.5 minutes |
| | 2A | 0.18 | 0.15 | 0.13 | | 2a | The end of tool life at 2.5 minutes | The end of tool life at 1.7 minutes | The end of tool life at 3.0 minutes |
| | 3A | 0.28 | 0.26 | 0.25 | | 3a | The end of tool life at 4.1 minutes | The end of tool life at 3.6 minutes | The end of tool life at 4.6 minutes |
| | 4A | 0.16 | 0.14 | 0.11 | | 4a | The end of tool life at 2.2 minutes | The end of tool life at 1.3 minutes | The end of tool life at 2.7 minutes |
| | 5A | 0.22 | 0.20 | 0.17 | | 5a | The end of tool life at 3.4 minutes | The end of tool life at 2.3 minutes | The end of tool life at 3.4 minutes |
| | 6A | 0.14 | 0.12 | 0.09 | | 6a | The end of tool life at 1.8 minutes | The end of tool life at 0.9 minutes | The end of tool life at 2.6 minutes |
| | 7A | 0.26 | 0.24 | 0.23 | | 7a | The end of tool life at 3.9 minutes | The end of tool life at 3.1 minutes | The end of tool life at 4.2 minutes |
| | 8A | 0.12 | 0.10 | 0.08 | | 8a | The end of tool life at 1.5 minutes | The end of tool life at 0.7 minutes | The end of tool life at 2.2 minutes |
| | 9A | 0.23 | 0.20 | 0.20 | | 9a | The end of tool life at 3.7 minutes | The end of tool life at 3.0 minutes | The end of tool life at 3.8 minutes |
| | 10A | 0.19 | 0.18 | 0.15 | | 10a | The end of tool life at 3.0 minutes | The end of tool life at 1.8 minutes | The end oftool life at 3.1 minutes |
| | 1B | 0.11 | 0.10 | 0.10 | | 1b | The end of tool life at 1.4 minutes | The end of tool life at 0.5 minutes | The end of tool life at 1.8 minutes |
| | 2B | 0.19 | 0.18 | 0.19 | | 2b | The end of tool life at 2.7 minutes | The end of tool life at 1.7 minutes | The end of tool life at 2.9 minutes |
| | 3B | 0.21 | 0.21 | 0.20 | | 3b | The end of tool life at 3.1 minutes | The end of tool life at 2.0 minutes | The end of tool life at 3.1 minutes |

TABLE 7-continued

| | Flank wear width (mm) | | | | Results of cutting tests | | |
|---|---|---|---|---|---|---|---|
| Classification | High speed and continuous cutting of alloy steel with large depth of cut | High speed and interrupted cutting of alloy steel with large feed | High speed and continuous cutting of cast iron with large depth of cut | Classification | High speed and continuous cutting of alloy steel with large depth of cut | High speed and interrupted cutting of alloy steel with large feed | High speed and continuous cutting of cast iron with large depth of cut |
| 4B | 0.16 | 0.17 | 0.15 | 4b | The end of tool life at 2.1 minutes | The end of tool life at 1.5 minutes | The end of tool life at 2.7 minutes |
| 5B | 0.27 | 0.26 | 0.28 | 5b | The end of tool life at 3.9 minutes | The end of tool life at 3.3 minutes | The end of tool life at 4.4 minutes |
| 6B | 0.25 | 0.23 | 0.22 | 6b | The end of tool life at 3.4 minutes | The end of tool life at 2.9 minutes | The end of tool life at 3.7 minutes |

(In the TABLE, the end of tool life was reached due to chipping at the cutting edge)

EXAMPLE 2

Ingredient powders, i.e., medium coarse powder of WC having an average grain size of 5.5 μm, fine powder of WC having an average grain size of 0.8 μm, powder of TaC having an average grain size of 1.3 μm, powder of NbC having an average grain size of 1.2 μm, powder of ZrC having an average grain size of 1.2 μm, powder of $Cr_3C_2$ having an average grain size of 2.3 μm, powder of VC having an average grain size of 1.5 μm, powder of (Ti, W)C having an average grain size of 1.0 μm, and powder of Co having an average grain size of 1.8 μm, were prepared. The ingredient powders were blended according to the blending ratios shown in TABLE 8, were mixed in acetone after adding wax for 50 hours using a ball mill, were subjected to vacuum drying, and were compacted under a pressure of 100 MPa so as to obtain various green compacts having predetermined shapes. The green compacts were held in a vacuum of 6 Pa while increasing temperature from 1370° C. to 1470° C. at a temperature increasing rate of 7° C./min, were further held at this temperature for 1 hour, and were cooled in the a furnace so as to be sintered and so as to obtain sintered round bars for forming three types of hard substrates, each type having one of diameters of 8 mm, 13 mm, and 26 mm. The three types of hard substrates were subjected to grinding so as to obtain hard substrates (end mill) C-1 to C-8, each of which is a square type end mill having four cutting edges with a twist angle of 30°, the cutting edges thereof dimensionally defined by one of combinations of diameter and length (diameter×length), i.e., one of 6 mm×13 mm, 10 mm×22 mm, and 20 mm×45 mm, as shown in TABLE 8.

Next, the hard substrates (end mill) C-1 to C-8 were subjected to ultrasonic cleaning in acetone, and then the hard substrates C-1 to C-8 were dried, and were mounted in the arc ion plating apparatus shown in FIGS. 1A and 1B, and then, under the same conditions as in Example 1, a hard coating layer, which had component composition profile in which the maximum Al containing points and the minimum Al containing points having a designated composition shown in TABLE 9 appear alternatingly and repeatedly at a designated interval also shown in TABLE 9 in the thickness direction, and the amount of contained Al component continuously varies from the maximum Al containing points to the minimum Al containing points and from the minimum Al containing points to the maximum Al containing points, and which had a designated overall layer thickness also shown in TABLE 9, was formed by a vapor deposition method, and thereby surface-coated hard metal end mills 1C to 8C of the present invention (hereinafter referred to as coated end mills of the present invention), as the coated cutting tools of the present invention, were fabricated.

For the purpose of comparison, the surfaces of the hard substrates (end mills) C-1 to C-8 were subjected to ultrasonic cleaning in acetone, and then the hard substrates C-1 to C-8 were dried, and were mounted in a conventional arc ion plating apparatus shown in FIG. 2. Under the same conditions as in Example 1, a hard coating layer, which had a designated composition and a designated layer thickness shown in TABLE 10, and which included a (Ti, Al, Zr)N layer in which composition was substantially constant in the direction of the layer thickness, was formed by a vapor deposition method, and thereby conventional surface-coated hard metal end mills 1c to 8c (hereinafter referred to as conventional coated end mills), as conventional coated cutting tools, were fabricated.

Next, among the coated end mills 1C to 8C of the present invention and the conventional coated end mills 1c to 8c, the coated end mills 1C to 3C of the present invention and the conventional coated end mills 1c to 3c were subjected to wet and high-speed side milling tests with a large depth of cut in which workpieces of cast iron were machined under the following conditions,
workpiece: a plate of FC300 defined in the JIS having a plane size of 100 mm×250 mm, and a thickness of 50 mm,
cutting speed: 320 m/min,
depth of cut in the axial direction: 10 mm,
depth of cut in the radial direction: 1.8 mm, and
table feed: 210 mm/min.

The coated end mills 4C to 6C of the present invention and the conventional coated end mills 4c to 6c were subjected to wet and high-speed side milling tests with a large depth of cut in which workpieces of alloy steel were machined under the following conditions,
workpiece: a plate of SCM440 defined in the JIS having a plane size of 100 mm×250 mm, and a thickness of 50 mm,
cutting speed: 300 m/min,
depth of cut in the axial direction: 18 mm,
depth of cut in the radial direction: 3 mm, and
table feed: 195 mm/min.

The coated end mills 7C and 8C of the present invention and the conventional coated end mills 7c and 8c were subjected to wet and high-speed side milling tests with a large depth of cut in which workpieces of alloy steel were machined under the following conditions,
workpiece: a plate of SNCM439 defined in the JIS having a plane size of 100 mm×250 mm, and a thickness of 50 mm,
cutting speed: 290 m/min,
depth of cut in the axial direction: 40 mm,
depth of cut in the radial direction: 6 mm, and
table feed: 100 mm/min.

In each of the wet side milling tests (in which a water-miscible cutting fluid was used), a milling operation was performed until flank wear width of the cutting edge portion reached 0.1 mm, which indicates the end of the tool life, and the length of cut groove was measured. The test results are shown in TABLES 9 and 10.

TABLE 8

| Classification | | Co | (Ti, W)C | TaC | NbC | ZrC | Cr₃C₂ | VC | WC | Diameter × length of cutting edge (mm) |
|---|---|---|---|---|---|---|---|---|---|---|
| Substrate (end mill) | C-1 | 12 | — | — | — | — | 0.8 | — | Fine grain: Balance | 6 × 13 |
| | C-2 | 10 | — | — | — | — | 0.4 | 0.4 | Fine grain: Balance | 6 × 13 |
| | C-3 | 8.5 | 10 | 10 | 7 | — | — | — | Medium coarse grain: Balance | 6 × 13 |
| | C-4 | 10 | — | — | — | — | 0.5 | — | Fine grain: Balance | 10 × 22 |
| | C-5 | 9 | 8 | 9 | 1 | — | — | — | Medium coarse grain: Balance | 10 × 22 |
| | C-6 | 6 | — | 1 | — | — | — | — | Fine grain: Balance | 10 × 22 |
| | C-7 | 11 | — | — | — | — | 1 | — | Fine grain: Balance | 20 × 45 |
| | C-8 | 8 | 5 | 1 | 5 | 5 | — | — | Medium coarse grain: Balance | 20 × 45 |

TABLE 9

| | | | Hard coating layer | | | | | | | | |
|---|---|---|---|---|---|---|---|---|---|---|---|
| | | Symbols of | Maximum Al containing points Designated composition (atomic ratio) | | | | Minimum Al containing points Designated composition (atomic ratio) | | | | Designated distance between two points | Designated overall layer thickness | Length of cut groove |
| Classification | | substrate | Ti | Al | Zr | N | Ti | Al | Zr | N | (μm) | (μm) | (m) |
| Coated end mill of the present invention | 1c | C-1 | 0.30 | 0.65 | 0.05 | 1.00 | 0.75 | 0.20 | 0.05 | 1.00 | 0.01 | 1 | 89 |
| | 2c | C-2 | 0.35 | 0.55 | 0.10 | 1.00 | 0.60 | 0.30 | 0.10 | 1.00 | 0.03 | 3 | 103 |
| | 3c | C-3 | 0.40 | 0.45 | 0.15 | 1.00 | 0.59 | 0.40 | 0.01 | 1.00 | 0.07 | 4 | 110 |
| | 4c | C-4 | 0.39 | 0.60 | 0.01 | 1.00 | 0.70 | 0.25 | 0.05 | 1.00 | 0.10 | 6 | 60 |
| | 5c | C-5 | 0.35 | 0.55 | 0.10 | 1.00 | 0.75 | 0.15 | 0.10 | 1.00 | 0.08 | 8 | 69 |
| | 6c | C-6 | 0.45 | 0.50 | 0.05 | 1.00 | 0.50 | 0.35 | 0.15 | 1.00 | 0.06 | 10 | 74 |
| | 7c | C-7 | 0.35 | 0.60 | 0.05 | 1.00 | 0.65 | 0.25 | 0.10 | 1.00 | 0.04 | 12 | 66 |
| | 8c | C-8 | 0.40 | 0.50 | 0.10 | 1.00 | 0.60 | 0.35 | 0.05 | 1.00 | 0.02 | 15 | 73 |

TABLE 10

| | | | Hard coating layer | | | | | |
|---|---|---|---|---|---|---|---|---|
| | | Symbols of | Designated composition (atomic ratio) | | | | Designated layer | Length of cut groove |
| Classification | | substrate | Ti | Ali | Zr | N | thickness (μm) | (m) |
| Conventional coated end mill | 1c | C-1 | 0.30 | 0.65 | 0.05 | 1.00 | 1 | The end of tool life at 36 m |
| | 2c | C-2 | 0.35 | 0.55 | 0.10 | 1.00 | 3 | The end of tool life at 42 m |
| | 3c | C-3 | 0.40 | 0.45 | 0.15 | 1.00 | 4 | The end of tool life at 45 m |
| | 4c | C-4 | 0.39 | 0.60 | 0.01 | 1.00 | 6 | The end of tool life at 23 m |
| | 5c | C-5 | 0.35 | 0.55 | 0.10 | 1.00 | 8 | The end of tool life at 22 m |
| | 6c | C-6 | 0.45 | 0.50 | 0.05 | 1.00 | 10 | The end of tool life at 18 m |
| | 7c | C-7 | 0.35 | 0.60 | 0.05 | 1.00 | 12 | The end of tool life at 15 m |
| | 8c | C-8 | 0.40 | 0.50 | 0.10 | 1.00 | 15 | The end of tool life at 11 m |

(In the TABLE, the end of tool life was reached due to chipping at the cutting edge)

EXAMPLE 3

The three types of sintered round bars, i.e., the round bars having a diameter of 8 mm (for forming hard substrates C-1 to C-3), the round bars having a diameter of 13 mm (for forming hard substrates C-4 to C-6), and the round bars having a diameter of 26 mm (for forming hard substrates C-7 and C-8), fabricated in Example 2 were subjected to grinding so as to obtain hard substrates (drills) D-1 to D-8, each of which has two cutting edges with a twist angle of 30°, and more specifically, to obtain hard substrates D-1 to D-3 having a fluted portion size of 4 mm×13 mm (diameter× length), hard substrates D-4 to D-6 having a fluted portion size of 8 mm×22 mm, and hard substrates D-7 and D-8 having a fluted portion size of 16 mm×45 mm.

Next, honing processes were applied to the cutting edges of the hard substrates (drills) D-1 to D-8, the hard substrates D-1 to D-8 were subjected to ultrasonic cleaning in acetone, were dried, and were mounted in the arc ion plating apparatus shown in FIGS. 1A and 1B, and then, under the same conditions as in Example 1, a hard coating layer, which had component composition profile in which the maximum Al containing points and the minimum Al containing points having a designated composition shown in TABLE 11 appear alternatingly and repeatedly at a designated interval also shown in TABLE 11 in the thickness direction, and the amount of contained Al component continuously varies from the maximum Al containing points to the minimum Al containing points and from the minimum Al containing points to the maximum Al containing points, and which had a designated overall layer thickness also shown in TABLE 11, was formed by a vapor deposition method, and thereby surface-coated hard metal drills 1D to 8D of the present invention (hereinafter referred to as coated drills of the present invention), as the coated cutting tools of the present invention, were fabricated.

For the purpose of comparison, honing processes were applied to the surfaces of the hard substrates (drills) D-1 to D-8, the hard substrates D-1 to D-8 were subjected to ultrasonic cleaning in acetone, and then the hard substrates D-1 to D-8 were dried, and were mounted in a conventional arc ion plating apparatus shown in FIG. 2. Under the same conditions as in Example 1, a hard coating layer, which had a designated composition and a designated layer thickness shown in TABLE 12, and which included an (Ti, Al, Zr)N layer in which composition was substantially constant in the direction of the layer thickness, was formed by a vapor deposition method, and thereby conventional surface-coated hard metal drills 1d to 8d (hereinafter referred to as conventional coated drills), as conventional coated cutting tools, were fabricated.

Next, among the coated drills 1D to 8D of the present invention and the conventional coated drills 1d to 8d, the coated drills 1D to 3D of the present invention and the conventional coated drills 1d to 3d were subjected to wet and high-speed drilling tests with a large depth of cut in which workpieces of cast iron were machined under the following conditions, workpiece: a plate of FC300 defined in the JIS having a plane size of 100 mm×250 mm, and a thickness of 50 mm,
cutting speed: 200 m/min,
feed: 0.5 mm/rev, and
depth of hole: 10 mm.

The coated drills 4D to 6D of the present invention and the conventional coated drills 4d to 6d were subjected to wet and high-speed drilling tests with a large depth of cut in which workpieces of alloy steel were machined under the following conditions, workpiece: a plate of SCM440 defined in the JIS having a plane size of 100 mm×250 mm, and a thickness of 50 mm,
cutting speed: 175 m/min,
feed: 0.4 mm/rev, and
depth of hole: 1.5 mm.

The coated hard metal drills 7D and 8D of the present invention and the conventional coated hard metal drills 7d and 8d were subjected to wet and high-speed drilling tests with a large depth of cut in which workpieces of alloy steel were machined under the following conditions, workpiece: a plate of SNCM439 defined in the JIS having a plane size of 100 mm×250 mm, and a thickness of 50 mm,
cutting speed: 175 m/min,
feed: 0.5 mm/rev, and
depth of hole: 30 mm.

In each of the wet and high-speed drilling tests with a large depth of cut (in which a water-miscible cutting fluid was used), holes were formed until flank wear width of the cutting edge of the tip portion reached 0.3 mm, and the number of the holes was counted. The test results are shown in TABLES 11 and 12.

TABLE 11

| Classification | Symbols | substrate | Hard coating layer | | | | | | | | Designated distance between two points (μm) | Designated overall layer thickness (μm) | Number of drilled holes |
|---|---|---|---|---|---|---|---|---|---|---|---|---|---|
| | | | Maximum Al containing points Designated composition (atomic ratio) | | | | Minimum Al containing points Designated composition (atomic ratio) | | | | | | |
| | | | Ti | Al | Zr | N | Ti | Al | Zr | N | | | |
| Coated drill of the present invention | 1D | D-1 | 0.30 | 0.55 | 0.15 | 1.00 | 0.60 | 0.35 | 0.05 | 1.00 | 0.03 | 4 | 1349 |
| | 2D | D-2 | 0.45 | 0.45 | 0.10 | 1.00 | 0.75 | 0.15 | 0.10 | 1.00 | 0.01 | 3 | 1184 |
| | 3D | D-3 | 0.34 | 0.65 | 0.01 | 1.00 | 0.55 | 0.30 | 0.15 | 1.00 | 0.08 | 1 | 903 |
| | 4D | D-4 | 0.40 | 0.55 | 0.05 | 1.00 | 0.59 | 0.40 | 0.01 | 1.00 | 0.06 | 6 | 1086 |
| | 5D | D-5 | 0.30 | 0.60 | 0.10 | 1.00 | 0.75 | 0.20 | 0.05 | 1.00 | 0.10 | 10 | 1435 |
| | 6D | D-6 | 0.35 | 0.50 | 0.15 | 1.00 | 0.65 | 0.25 | 0.10 | 1.00 | 0.02 | 8 | 1242 |
| | 7D | D-7 | 0.40 | 0.55 | 0.05 | 1.00 | 0.65 | 0.20 | 0.15 | 1.00 | 0.07 | 12 | 698 |
| | 8D | D-8 | 0.30 | 0.60 | 0.10 | 1.00 | 0.65 | 0.30 | 0.05 | 1.00 | 0.04 | 15 | 866 |

TABLE 12

| Classification | Symbols of substrate | Hard coating layer | | | | Designated layer thickness (μm) | Number of drilled holes |
| --- | --- | --- | --- | --- | --- | --- | --- |
| | | Designated composition (atomic ratio) | | | | | |
| | | Ti | Al | Zr | N | | |
| Conventional coated drill 1d | D-1 | 0.30 | 0.55 | 0.15 | 1.00 | 4 | The end of tool life at 384 holes |
| 2d | D-2 | 0.45 | 0.45 | 0.10 | 1.00 | 3 | The end of tool life at 416 holes |
| 3d | D-3 | 0.34 | 0.65 | 0.01 | 1.00 | 1 | The end of tool life at 465 holes |
| 4d | D-4 | 0.40 | 0.55 | 0.05 | 1.00 | 6 | The end of tool life at 552 holes |
| 5d | D-5 | 0.30 | 0.60 | 0.10 | 1.00 | 10 | The end of tool life at 361 holes |
| 6d | D-6 | 0.35 | 0.50 | 0.15 | 1.00 | 8 | The end of tool life at 433 holes |
| 7d | D-7 | 0.40 | 0.55 | 0.05 | 1.00 | 12 | The end of tool life at 295 holes |
| 8d | D-8 | 0.30 | 0.60 | 0.10 | 1.00 | 15 | The end of tool life at 180 holes |

(In the TABLE, the end of tool life was reached due to chipping at the cutting edge)

The compositions of the maximum Al containing points and the minimum Al containing points of the hard coating layers which were included in the coated cutting tools of the present invention, i.e., in the coated inserts 1A to 8A and 1B to 6B of the present invention, in the coated end mills 1C to 8C of the present invention, and in the coated drills 1D to 8D, and the compositions of the hard coating layers which were included in the conventional coated cutting tools, i.e., in the conventional coated inserts 1a to 8a and 1b to 6b, in the conventional coated end mills 1c to 8c, in the conventional coated drills 1d to 8d, were analyzed using an Auger electron spectroscopic analyzer, and it was confirmed that the compositions were substantially the same as the designated compositions, respectively.

In addition, the distances between the maximum Al containing points and the minimum Al containing points, and the overall thicknesses of the hard coating layers of the coated cutting tools of the present invention, and the overall thicknesses of the hard coating layers of the conventional coated cutting tools were measured using a scanning electron microscope, and it was confirmed that the distances and thicknesses were substantially the same as the designated ones, respectively.

According to the results shown in TABLES 3 to 12, it is apparent that the coated cutting tools of the present invention, which include the hard coating layer having a component composition profile in which the maximum Al containing points, which exhibit desired high temperature hardness, heat resistance, and high temperature strength, and the minimum Al containing points, which exhibit relatively superior strength and toughness, appear alternatingly and repeatedly at a predetermined interval in a direction of thickness of the hard coating layer, and the amount of contained Al component continuously varies from the maximum Al containing points to the minimum Al containing points and from the minimum Al containing points to the maximum Al containing points, exhibit a superior chipping resistance during high speed cutting operations for various kinds of steels and cast irons under severe cutting conditions, such as with a large depth of cut or a large feed, in which large mechanical impacts occur, and in contrast, the conventional coated cutting tools, in which the hard coating layer is of the (Ti, Al, Zr)N layer in which composition is substantially constant in the direction of the layer thickness, exhibit chipping of the cutting edge and relatively short tool life during high speed cutting operations under severe cutting conditions due to insufficient strength and toughness of the hard coating layer.

EXAMPLE 4

Ingredient powders, i.e., powders of WC, TiC, VC, TaC, NbC, $Cr_3C_2$, and Co, all of which have an average grain size in a range from 1 to 3 μm, were prepared and mixed in accordance with blending ratios shown in TABLE 13. The ingredient powders were mixed under wet conditions using a ball mill for 48 hours, were dried, and were compacted under pressure of 100 MPa so as to form green compacts. The green compacts were held in a vacuum of 6 Pa at a temperature of 1420° C. for 1 hour so as to be sintered. After sintering, a honing process, in which a radius is set to be 0.05, is applied to cutting edge portions of each of the sintered compacts so as to obtain hard substrates E-1 to E-10 of WC based hard metal, each of which had an insert shape defined as CNMG120412 in the ISO standard.

Moreover, ingredient powders, i.e., powders of TiCN (TiC/TiN=50/50 when expressed by weight ratio), $Mo_2C$, ZrC, NbC, TaC, WC, Co, and Ni, all of which had an average grain size in a range from 0.5 to 2 μm, were prepared and mixed in accordance with blending ratios shown in TABLE 14. The ingredient powders were mixed under wet conditions using a ball mill for 72 hours, were dried, and were compacted under pressure of 100 MPa so as to form green compacts. The green compacts were held in a nitrogen atmosphere of 2 kPa at a temperature of 1520° C. for 1 hour so as to be sintered. After sintering, a honing process, in which a radius is set to be 0.05, is applied to cutting edge portions of each of the sintered compacts so as to obtain hard substrates F-1 to F-6 of TiCN cermet, each of which had an insert shape defined as CNMG120412 in the ISO standard.

Furthermore, ingredient powders, i.e., powders of cubic boron nitride (hereinafter termed c-BN), titanium carbide (hereinafter termed TiC), titanium nitride (hereinafter termed TiN), titanium carbonitride (hereinafter termed TiCN), tungsten carbide (hereinafter termed WC), Al, Ti₃Al and TiAl₃ which are powders of intermetallic compounds of Ti and Al, and aluminum oxide (termed Al₂O₃), all of which have an average grain size in a range from 0.5 to 4 μm, were prepared and mixed in accordance with blending ratios shown in TABLE 15. The ingredient powders were mixed under wet conditions using a ball mill for 72 hours, were dried, and were compacted under pressure of 100 MPa so as to form a green compact having a diameter of 50 mm and a thickness of 1.5 mm. The green compact was held in a vacuum at a pressure of 1 Pa at a predetermined temperature in a range from 900 to 1300° C. for 30 minutes so as to obtain a pre-sintered compact for forming a cutting piece. The pre-sintered compact was superposed on a supporting piece of a WC based hard metal plate which was separately prepared and had a diameter of 50 mm and a thickness of 2 mm, and which has a composition in which 8 wt % of Co and WC as the balance were included, and then the pre-sintered compact with the supporting piece was inserted into a conventional ultra-high pressure sintering apparatus, and was held under normal sintering conditions, i.e., a pressure of 5 GPa, a temperature in a range from 1200 to 1400° C., and a retention time of 0.5 hours, so as to be sintered under ultra-high pressure conditions. After sintering, upper and lower faces of the sintered compact were ground using a diamond grinding wheel, and the sintered compact was cut into equilateral triangles having 3 mm sides using an arc discharge wire-cut method, and then each of the triangular sintered compacts was brazed to a brazing portion (a corner portion) of a WC based hard metal insert body, which has a shape defined in the CIS standard-TNGA160408 (an equilateral triangle having 16 mm sides and a thickness of 4.76 mm) and has a composition in which 5 wt % of Co, 5 wt % of TaC, and WC as the balance were included, using a brazing agent of an Ag alloy having a composition in which 30 wt % of Cu, 28 wt % of Zn, 2 wt % of Ni, and Ag as the balance were included, and finish grinding was applied so as to obtain insert substrates G-1 to G-6 of c-BN based sintered material.

The hard substrates E-1 to E-10, F-1 to F-6, and G-1 to G-6 were subjected to ultrasonic cleaning in acetone, were dried, and were mounted in a conventional arc ion plating apparatus shown in FIG. 2. In the arc ion plating apparatus, Ti—Al—Zr—Y alloy piece and Ti—Al—Zr—Ce alloy piece having various compositions depending on desired hard coating layers were set as a cathode electrode (evaporation source), a metallic Ti piece for bombardment cleaning was also set, the inside of the apparatus was evacuated and was held at a vacuum at a pressure of 0.5 Pa or less, and the inside of the apparatus was heated to a temperature of 700° C. using a heater. Then, a DC bias voltage of −1000 V was applied to the hard substrates, and an electric current of 100A was made flow as an arc discharge between the cathode electrode, i.e., the metallic Ti piece, and an anode electrode, so that the surfaces of the hard substrates were subjected to Ti bombardment cleaning. Next, a nitrogen gas, as a reaction gas, was introduced into the apparatus so as to prepare a reaction atmosphere at a pressure of 2 Pa, the bias voltage applied to the hard substrates was decreased to −50 V, and an electric current of 150A was made to flow as an arc discharge between the cathode electrode and the anode electrode so that a hard coating layer of nitride compound, which had a designated composition of metallic elements and a designated layer thickness shown in TABLE 16, was formed on the surface of each of the hard substrates, and thereby coated inserts 1E to 10E, 1F to 6F, and 1G to 6G of the present invention were fabricated.

Moreover, hard substrates E-1 to E-10, F-1 to F-6, and G-1 to G-6 were subjected to ultrasonic cleaning in an acetone solvent, were dried, and were mounted on a turntable housed in an arc ion plating apparatus shown in FIGS. 1A and 1B at positions along the inner circumference of the turntable. In the arc ion plating apparatus, Ti—Al—Zr—Y alloy piece and Ti—Al—Zr—Ce alloy piece having various compositions for forming maximum Al containing points was set as a cathode electrode (evaporation source), Ti—Al—Zr—Y alloy piece and Ti—Al—Zr—Ce alloy piece having various compositions for forming minimum Al containing points was set as another cathode electrode (evaporation source) so as to oppose to the other cathode electrode while having the turntable therebetween, and a metallic Ti piece for bombardment cleaning was also set. The inside of the apparatus was evacuated and was held at a vacuum at a pressure of 0.5 Pa or less, and the inside of the apparatus was heated to a temperature of 500° C. using a heater. Then, a DC bias voltage of −1000 V was applied to the hard substrates which are turned while rotating on the turntable about the respective axes thereof, and an electric current of 100A was made flow as an arc discharge between the cathode electrode, i.e., the metallic Ti piece, and an anode electrode, so that the surfaces of the hard substrates were subjected to Ti bombardment cleaning. Next, a nitrogen gas, as a reaction gas, was introduced into the apparatus so as to prepare a reaction atmosphere at a pressure of 2 Pa, a DC bias voltage of −50 V was applied to the hard substrates which are turned while rotating on the turntable about the respective axes thereof, and an electric current of 150A was made to flow as an arc discharge between the cathode electrodes and the anode electrodes, respectively, so that a hard coating layer, which had component composition profile in which the maximum Al containing points and the minimum Al containing points having a designated composition of metallic elements shown in TABLE 17 appear alternatingly and repeatedly at a designated interval also shown in TABLE 17 in the thickness direction, and the amount of contained Al component continuously varies from the maximum Al containing points to the minimum Al containing points and from the minimum Al containing points to the maximum Al containing points, and which had a designated overall layer thickness also shown in TABLE 17, was formed, by a vapor deposition method, on the surface of each of the hard substrates, and thereby coated inserts 11E to 20E, 7F to 12F, and 7G to 12G of the present invention were fabricated.

For the purpose of comparison, the hard substrates E-1 to E-10, F-1 to F-6, and G-1 to G-6 were subjected to ultrasonic cleaning in acetone, were dried, and were mounted in a conventional arc ion plating apparatus shown in FIG. 2. In the arc ion plating apparatus, Ti—Al alloy piece, Ti—Al—Si alloy piece, Ti—Al—Y alloy piece, Ti—Al—Zr alloy piece, Ti—Al—V alloy piece, Ti—Al—Nb alloy piece, and Ti—Al—Cr alloy piece having various compositions were set as cathode electrodes, a metallic Ti piece for bombardment cleaning was also set, the inside of the apparatus was evacuated and was held at a vacuum at a pressure of 0.5 Pa or less, and the inside of the apparatus was heated to a temperature of 700° C. using a heater. Then, a DC bias voltage of −1000 V was applied to the hard substrates, and an electric current of 100A was made flow as an arc discharge between the cathode electrode, i.e., the metallic Ti piece, and an anode electrode, so that the surfaces of the hard substrates were subjected to Ti bombardment cleaning. Next, a nitrogen gas, as a reaction gas, was introduced into the apparatus so as to prepare a reaction atmosphere at a pressure of 2 Pa, the bias voltage applied to the hard substrates was decreased to −50 V, and an electric current of 150A was made to flow as an arc discharge between the cathode electrodes and the anode electrode so that a hard coating layer of nitride compound, which had a designated composition of metallic elements and a designated layer thickness shown in TABLE 18, was formed on the surface of each of the hard substrates, and thereby conventional coated inserts 1e to 10e, 1f to 6f, and 1 g to 6g of the present invention were fabricated.

Next, among the various coated inserts fabricated as described above, the coated inserts 1E to 20E of the present invention and the conventional coated inserts 1e to 10 e were subjected to cutting tests by attaching each of them to a tip portion of a cutting tool made of tool steel. The detailed test conditions were set as follows:

with regard to high-speed, dry, and continuous cutting tests in which workpieces of alloy steel were machined,
workpiece: a round bar of SCM440 defined in the JIS,
cutting speed: 400 m/min,
feed: 0.2 mm/rev,
depth of cut: 2 mm,
time: 5 min; and
with regard to dry and continuous cutting tests under high-speed and severe cutting conditions in which workpieces of alloy steel were machined,
workpiece: a round bar of SCM440 defined in the JIS,
cutting speed: 400 m/min,
feed: 0.4 mm/rev,
depth of cut: 4 mm,
time: 5 min.

In each of the cutting tests, flank wear width of the cutting edge was measured. The test results are shown in TABLE 19.

Moreover, the coated inserts 1F to 12F of the present invention and the conventional coated inserts 1f to 6f were subjected to cutting tests. The detailed test conditions were set as follows:

with regard to high-speed, dry, and continuous cutting tests in which workpieces of alloy steel were machined,
workpiece: a round bar of SCM440 defined in the JIS,
cutting speed: 450 m/min,
feed: 0.2 mm/rev,
depth of cut: 0.5 mm,
time: 5 min; and
with regard to dry and continuous cutting tests under high-speed and severe cutting conditions in which workpieces of alloy steel were machined,
workpiece: a round bar of SCM440 defined in the JIS,
cutting speed: 450 m/min,
feed: 0.3 mm/rev,
depth of cut: 1.5 mm,
time: 5 min.

In each of the cutting tests, flank wear width of the cutting edge was measured. The test results are shown in TABLE 20.

Furthermore, the coated inserts 1G to 12G of the present invention and the conventional coated inserts 1g to 6g were subjected to cutting tests. The detailed test conditions were set as follows:

with regard to high-speed, dry, and continuous cutting tests in which workpieces of hardened steel were machined,
workpiece: a round bar of cemented hardened steel SCM440 defined in the JIS (surface hardness: HRC60),
cutting speed: 400 m/min,
feed: 0.1 mm/rev,
depth of cut: 0.1 mm,
time: 5 min; and
with regard to dry and continuous cutting tests under high-speed and severe cutting conditions in which workpieces of hardened steel were machined,
workpiece: a round bar of cemented hardened steel SCM440 defined in the JIS (surface hardness: HRC60),
cutting speed: 400 m/min,
feed: 0.2 mm/rev,
depth of cut: 0.2 mm,
time: 5 min.

In each of the cutting tests, flank wear width of the cutting edge was measured. The test results are shown in TABLE 21.

TABLE 13

| Classification | | Blending ratio (wt %) | | | | | |
|---|---|---|---|---|---|---|---|
| | | Co | TiC | TaC | NbC | VC | $Cr_3C_2$ | WC |
| Substrate | E-1 | 5.5 | — | — | — | — | 0.3 | Balance |
| | E-2 | 6.5 | — | 1 | — | — | — | Balance |
| | E-3 | 7 | — | — | — | — | 0.4 | Balance |
| | E-4 | 7.5 | 2 | — | 1 | — | — | Balance |
| | E-5 | 8.5 | — | — | — | 0.3 | 0.3 | Balance |
| | E-6 | 9 | 6 | — | 4 | — | — | Balance |
| | E-7 | 10 | — | 1 | — | — | 0.5 | Balance |
| | E-8 | 11 | 5 | — | 7 | — | 0.5 | Balance |
| | E-9 | 12.5 | — | — | — | 1.5 | 0.8 | Balance |
| | E-10 | 11.5 | 10 | — | 8 | — | — | Balance |

TABLE 14

| Classification | | Blending ratio (wt %) | | | | | | | |
|---|---|---|---|---|---|---|---|---|---|
| | | Co | Ni | ZrC | TaC | NbC | $MO_2C$ | WC | TiCN |
| Substrate | F-1 | 15 | 5 | — | 10 | — | 10 | 16 | Balance |
| | F-2 | 8 | 7 | — | 5 | — | 7.5 | — | Balance |
| | F-3 | 7 | 2 | — | — | — | 6 | 10 | Balance |
| | F-4 | 13 | 7 | — | 11 | 2 | — | — | Balance |
| | F-5 | 9 | 6 | 1 | 8 | — | 10 | 10 | Balance |
| | F-6 | 14 | 5 | — | 10 | — | 9.5 | 14.5 | Balance |

TABLE 15

| Classification | | Blending ratio (wt %) | | | | | | | |
|---|---|---|---|---|---|---|---|---|---|
| | | TiN | TiCN | TiC | WC | Al | $TiAl_3$ | $Ti_3Al$ | $Al_2O_3$ | cBN |
| Substrate | G-1 | 39 | — | — | 2 | — | 10 | — | 2 | Balance |
| | G-2 | — | 20 | 12 | — | — | — | 15 | 1 | Balance |
| | G-3 | 10 | — | 19 | 1 | 9 | — | — | 2 | Balance |
| | G-4 | 25 | 10 | — | — | — | 12 | — | 4 | Balance |

TABLE 15-continued

| Classification | Blending ratio (wt %) | | | | | | | | |
|---|---|---|---|---|---|---|---|---|---|
| | TiN | TiCN | TiC | WC | Al | TiAl₃ | Ti₃Al | Al₂O₃ | cBN |
| G-5 | 12 | 10 | 10 | 3 | — | 5 | 3 | 2 | Balance |
| G-6 | 30 | 16 | — | 1 | 2 | 8 | — | 5 | Balance |

TABLE 16

| | | | Hard coating layer | | | | | |
|---|---|---|---|---|---|---|---|---|
| Classification | | Symbols of substrate | Designated composition (atomic ratio) | | | | | Designated layer thickness (μm) |
| | | | Al | Zr | Y | Ce | Ti | |
| Coated Insert of the invention | 1E | E-1 | 0.45 | 0.020 | 0.0050 | — | Balance | 5 |
| | 2E | E-2 | 0.45 | 0.020 | — | 0.0050 | Balance | 5 |
| | 3E | E-3 | 0.20 | 0.020 | 0.0030 | 0.0030 | Balance | 5 |
| | 4E | E-4 | 0.50 | 0.040 | 0.0200 | — | Balance | 5 |
| | 5E | E-5 | 0.30 | 0.060 | 0.0010 | — | Balance | 5 |
| | 6E | E-6 | 0.40 | 0.100 | 0.0005 | — | Balance | 5 |
| | 7E | E-7 | 0.05 | 0.100 | — | 0.0005 | Balance | 5 |
| | 8E | E-8 | 0.30 | 0.002 | 0.0500 | — | Balance | 10 |
| | 9E | E-9 | 0.55 | 0.010 | 0.0030 | — | Balance | 5 |
| | 10E | E-10 | 0.10 | 0.030 | — | 0.0100 | Balance | 10 |
| | 1F | F-1 | 0.45 | 0.020 | 0.0050 | — | Balance | 3 |
| | 2F | F-2 | 0.45 | 0.020 | — | 0.0050 | Balance | 3 |
| | 3F | F-3 | 0.20 | 0.020 | 0.0030 | 0.0030 | Balance | 3 |
| | 4F | F-4 | 0.30 | 0.002 | 0.0500 | — | Balance | 3 |
| | 5F | F-5 | 0.55 | 0.010 | 0.0030 | — | Balance | 3 |
| | 6F | F-6 | 0.10 | 0.030 | — | 0.0100 | Balance | 5 |
| | 1G | G-1 | 0.45 | 0.020 | 0.0050 | — | Balance | 3 |
| | 2G | G-2 | 0.45 | 0.020 | — | 0.0050 | Balance | 3 |
| | 3G | G-3 | 0.20 | 0.020 | 0.0030 | 0.0030 | Balance | 3 |
| | 4G | G-4 | 0.30 | 0.002 | 0.0500 | — | Balance | 3 |
| | 5G | G-5 | 0.55 | 0.010 | 0.0030 | — | Balance | 3 |
| | 6G | G-6 | 0.10 | 0.030 | — | 0.0100 | Balance | 5 |

TABLE 17

| | | | Hard coating layer | | | | | | | | | | | |
|---|---|---|---|---|---|---|---|---|---|---|---|---|---|---|
| Classification | | Symbols of substrate | Maximum Al containing points Designated composition (atomic ratio) | | | | | Minimum Al containing points Designated composition (atomic ratio) | | | | | Designated distance between two points (μm) | Designated overall layer thickness (μm) |
| | | | Al | Zr | Y | Ce | Ti | Al | Zr | Y | Ce | Ti | | |
| Coated insert of the present invention | 11E | E-1 | 0.45 | 0.020 | 0.0050 | — | Balance | 0.25 | 0.020 | 0.0050 | — | Balance | 0.08 | 5 |
| | 12E | E-2 | 0.45 | 0.020 | — | 0.0050 | Balance | 0.25 | 0.020 | — | 0.0050 | Balance | 0.08 | 5 |
| | 13E | E-3 | 0.40 | 0.020 | 0.0030 | 0.0030 | Balance | 0.15 | 0.020 | 0.0030 | 0.0030 | Balance | 0.08 | 5 |
| | 14E | E-4 | 0.50 | 0.040 | 0.0200 | — | Balance | 0.15 | 0.040 | 0.0200 | — | Balance | 0.10 | 5 |
| | 15E | E-5 | 0.55 | 0.060 | 0.0010 | — | Balance | 0.15 | 0.060 | 0.0010 | — | Balance | 0.10 | 5 |
| | 16E | E-6 | 0.40 | 0.100 | 0.0005 | — | Balance | 0.25 | 0.100 | 0.0005 | — | Balance | 0.01 | 5 |
| | 17E | E-7 | 0.40 | 0.100 | — | 0.0005 | Balance | 0.05 | 0.100 | — | 0.0005 | Balance | 0.01 | 5 |
| | 18E | E-8 | 0.50 | 0.002 | 0.0500 | — | Balance | 0.15 | 0.002 | 0.0500 | — | Balance | 0.03 | 10 |
| | 10E | E-9 | 0.60 | 0.010 | 0.0030 | — | Balance | 0.05 | 0.030 | 0.0100 | — | Balance | 0.05 | 5 |
| | 20E | E-10 | 0.40 | 0.030 | — | 0.0100 | Balance | 0.10 | 0.030 | — | 0.0100 | Balance | 0.05 | 10 |
| | 7F | F-1 | 0.45 | 0.020 | 0.0050 | — | Balance | 0.25 | 0.020 | 0.0050 | — | Balance | 0.08 | 3 |
| | 8F | F-2 | 0.45 | 0.020 | — | 0.0050 | Balance | 0.25 | 0.020 | — | 0.0050 | Balance | 0.08 | 3 |
| | 9F | F-3 | 0.40 | 0.020 | 0.0030 | 0.0030 | Balance | 0.15 | 0.020 | 0.0030 | 0.0030 | Balance | 0.08 | 3 |
| | 10F | F-4 | 0.50 | 0.002 | 0.0500 | — | Balance | 0.15 | 0.002 | 0.0500 | — | Balance | 0.03 | 3 |
| | 11F | F-5 | 0.60 | 0.010 | 0.0030 | — | Balance | 0.05 | 0.030 | 0.0100 | — | Balance | 0.05 | 3 |
| | 12F | F-6 | 0.40 | 0.030 | — | 0.0100 | Balance | 0.10 | 0.030 | — | 0.0100 | Balance | 0.05 | 5 |
| | 7G | G-1 | 0.45 | 0.020 | 0.0050 | — | Balance | 0.25 | 0.020 | 0.0050 | — | Balance | 0.08 | 3 |
| | 8G | G-2 | 0.45 | 0.020 | — | 0.0050 | Balance | 0.25 | 0.020 | — | 0.0050 | Balance | 0.08 | 3 |
| | 9G | G-3 | 0.40 | 0.020 | 0.0030 | 0.0030 | Balance | 0.15 | 0.020 | 0.0030 | 0.0030 | Balance | 0.08 | 3 |
| | 10G | G-4 | 0.50 | 0.002 | 0.0500 | — | Balance | 0.15 | 0.002 | 0.0500 | — | Balance | 0.03 | 3 |
| | 11G | G-5 | 0.60 | 0.010 | 0.0030 | — | Balance | 0.05 | 0.030 | 0.0100 | — | Balance | 0.05 | 3 |
| | 12G | G-6 | 0.40 | 0.030 | — | 0.0100 | Balance | 0.10 | 0.030 | — | 0.0100 | Balance | 0.05 | 5 |

TABLE 18

| Classification | Symbols of substrate | Blending ratio (wt %) Designated composition (atomic ratio) | | | | | | | | Designated layer thickness (μm) |
|---|---|---|---|---|---|---|---|---|---|---|
| | | Ti | Al | Si | Y | Zr | V | Nb | Cr | |
| Conv. Coated insert | 1e  E-1 | 0.50 | 0.50 | — | — | — | — | — | — | 5 |
| | 2e  E-2 | 0.50 | 0.45 | 0.05 | — | — | — | — | — | 5 |
| | 3e  E-3 | 0.70 | 0.20 | 0.10 | — | — | — | — | — | 5 |
| | 4e  E-4 | 0.70 | 0.10 | 0.20 | — | — | — | — | — | 5 |
| | 5e  E-5 | 0.65 | 0.30 | — | 0.05 | — | — | — | — | 5 |
| | 6e  E-6 | 0.40 | 0.40 | — | 0.20 | — | — | — | — | 5 |
| | 7e  E-7 | 0.65 | 0.25 | — | — | 0.10 | — | — | — | 5 |
| | 8e  E-8 | 0.35 | 0.45 | — | — | — | 0.20 | — | — | 10 |
| | 9e  E-9 | 0.35 | 0.55 | — | — | — | — | 0.10 | — | 5 |
| | 10e E-10 | 0.40 | 0.40 | — | — | — | — | — | 0.20 | 10 |
| | 1f  F-1 | 0.40 | 0.60 | — | — | — | — | — | — | 3 |
| | 2f  F-2 | 0.40 | 0.57 | 0.03 | — | — | — | — | — | 3 |
| | 3f  F-3 | 0.45 | 0.45 | 0.10 | — | — | — | — | — | 3 |
| | 4f  F-4 | 0.90 | 0.05 | — | 0.05 | — | — | — | — | 3 |
| | 5f  F-5 | 0.68 | 0.30 | — | 0.02 | — | — | — | — | 3 |
| | 6f  F-6 | 0.60 | 0.30 | — | — | 0.10 | — | — | — | 5 |
| | 1g  G-1 | 0.55 | 0.45 | — | — | — | — | — | — | 3 |
| | 2g  G-2 | 0.50 | 0.45 | 0.05 | — | — | — | — | — | 3 |
| | 3g  G-3 | 0.45 | 0.45 | 0.10 | — | — | — | — | — | 3 |
| | 4g  G-4 | 0.65 | 0.30 | — | 0.05 | — | — | — | — | 3 |
| | 5g  G-5 | 0.84 | 0.15 | — | 0.01 | — | — | — | — | 3 |
| | 6g  G-6 | 0.60 | 0.10 | — | — | 0.30 | — | — | — | 5 |

TABLE 19

| Classification | | Flank wear width (mm) | |
|---|---|---|---|
| | | High speed cutting of alloy steel | High speed and severe cutting of alloy steel |
| Coated insert of the invention | 1E | 0.25 | 0.38 |
| | 2E | 0.25 | 0.42 |
| | 3E | 0.27 | 0.34 |
| | 4E | 0.24 | 0.35 |
| | 5E | 0.23 | 0.33 |
| | 6E | 0.26 | 0.40 |
| | 7E | 0.25 | 0.38 |
| | 8E | 0.27 | 0.38 |
| | 9E | 0.26 | 0.34 |
| | 10E | 0.25 | 0.36 |
| | 11E | 0.28 | 0.29 |
| | 12E | 0.27 | 0.28 |
| | 13E | 0.27 | 0.29 |
| | 14E | 0.28 | 0.29 |
| | 15E | 0.29 | 0.30 |
| | 16E | 0.28 | 0.31 |
| | 17E | 0.27 | 0.31 |
| | 18E | 0.26 | 0.28 |
| | 19E | 0.29 | 0.31 |
| | 20E | 0.27 | 0.29 |
| Conv. Coated insert | 1e | 0.38 | The end of tool life at 2.6 min. |
| | 2e | 0.36 | The end of tool life at 3.0 min. |
| | 3e | 0.41 | The end of tool life at 2.1 min. |
| | 4e | 0.40 | The end of tool life at 2.7 min. |
| | 5e | 0.38 | The end of tool life at 1.4 min. |
| | 6e | 0.36 | The end of tool life at 2.2 min. |
| | 7e | 0.37 | The end of tool life at 2.4 min. |
| | 8e | 0.39 | The end of tool life at 1.9 min. |
| | 9e | 0.39 | The end of tool life at 1.9 min. |
| | 10e | 0.38 | The end of tool life at 2.3 min. |

TABLE 20

| Classification | | Flank wear width (mm) | |
|---|---|---|---|
| | | High speed cutting of alloy steel | High speed and severe cutting of alloy steel |
| Coated insert of the invention | 1F | 0.23 | 0.44 |
| | 2F | 0.24 | 0.42 |
| | 3F | 0.25 | 0.41 |
| | 4F | 0.23 | 0.40 |
| | 5F | 0.25 | 0.45 |
| | 6F | 0.26 | 0.38 |
| | 7F | 0.27 | 0.29 |
| | 8F | 0.25 | 0.28 |
| | 9F | 0.25 | 0.26 |
| | 10F | 0.24 | 0.26 |
| | 11F | 0.25 | 0.27 |
| | 12F | 0.27 | 0.27 |
| Conv. Coated insert | 1f | 0.39 | The end of tool life at 2.2 min. |
| | 2f | 0.40 | The end of tool life at 2.6 min. |

TABLE 20-continued

<table>
<tr><th rowspan="2">Classification</th><th colspan="2">Flank wear width (mm)</th></tr>
<tr><th>High speed cutting of alloy steel</th><th>High speed and severe cutting of alloy steel</th></tr>
<tr><td>3f</td><td>0.42</td><td>The end of tool life at 1.8 min.</td></tr>
<tr><td>4f</td><td>0.41</td><td>The end of tool life at 1.9 min.</td></tr>
<tr><td>5f</td><td>0.38</td><td>The end of tool life at 2.1 min.</td></tr>
<tr><td>6f</td><td>0.39</td><td>The end of tool life at 2.6 min.</td></tr>
</table>

TABLE 21

<table>
<tr><th colspan="2" rowspan="2">Classification</th><th colspan="2">Flank wear width (mm)</th></tr>
<tr><th>High speed cutting of hardened steel</th><th>High speed and severe cutting of hardened steel</th></tr>
<tr><td rowspan="12">Coated insert of the invention</td><td>1G</td><td>0.19</td><td>0.28</td></tr>
<tr><td>2G</td><td>0.19</td><td>0.31</td></tr>
<tr><td>3G</td><td>0.18</td><td>0.30</td></tr>
<tr><td>4G</td><td>0.16</td><td>0.31</td></tr>
<tr><td>5G</td><td>0.17</td><td>0.28</td></tr>
<tr><td>6G</td><td>0.17</td><td>0.29</td></tr>
<tr><td>7G</td><td>0.18</td><td>0.19</td></tr>
<tr><td>8G</td><td>0.19</td><td>0.22</td></tr>
<tr><td>9G</td><td>0.18</td><td>0.22</td></tr>
<tr><td>10G</td><td>0.18</td><td>0.23</td></tr>
<tr><td>11G</td><td>0.17</td><td>0.19</td></tr>
<tr><td>12G</td><td>0.18</td><td>0.21</td></tr>
<tr><td rowspan="6">Conv. Coated insert</td><td>1g</td><td>0.27</td><td>The end of tool life at 2.1 min.</td></tr>
<tr><td>2g</td><td>0.29</td><td>The end of tool life at 1.9 min.</td></tr>
<tr><td>3g</td><td>0.29</td><td>The end of tool life at 2.5 min.</td></tr>
<tr><td>4g</td><td>0.32</td><td>The end of tool life at 3.3 min.</td></tr>
<tr><td>5g</td><td>The end of tool life at 3.6 min.</td><td>The end of tool life at 1.5 min.</td></tr>
<tr><td>6g</td><td>The end of tool life at 4.4 min.</td><td>The end of tool life at 2.2 min.</td></tr>
</table>

EXAMPLE 5

Ingredient powders, i.e., medium coarse powder of WC having an average grain size of 5.5 μm, fine powder of WC having an average grain size of 0.8 μm, powder of TaC having an average grain size of 1.3 μm, powder of NbC having an average grain size of 1.2 μm, powder of ZrC having an average grain size of 1.2 μm, powder of $Cr_3C_2$ having an average grain size of 2.3 μm, powder of VC having an average grain size of 1.5 μm, powder of (Ti, W)C having an average grain size of 1.0 μm, and powder of Co having an average grain size of 1.8 μm, were prepared. The ingredient powders were blended according to the blending ratios shown in TABLE 22, were mixed in acetone after adding wax for 50 hours using a ball mill, were subjected to vacuum drying, and were compacted under a pressure of 100 MPa so as to obtain various green compacts having predetermined shapes. The green compacts were held in a vacuum of 6 Pa while increasing temperature from 1370° C. to 1470° C. at a temperature increasing rate of 7° C./min, were further held at this temperature for 1 hour, and were cooled in a furnace so as to be sintered and so as to obtain sintered round bars for forming three types of hard substrates, each type having one of diameters of 8 mm, 13 mm, and 26 mm. The three types of hard substrates were subjected to grinding so as to obtain hard substrates (end mill) H-1 to H-8, each of which is a square type end mill having four cutting edges with a twist angle of 30°, the cutting edges thereof dimensionally defined by one of combinations of diameter and length (diameter×length), i.e., one of 6 mm×13 mm, 10 mm×22 mm, and 20 mm×45 mm, as shown in TABLE 22.

Next, the hard substrates H-1 to H-8 were subjected to ultrasonic cleaning in acetone, and then the hard substrates H-1 to H-8 were dried, and were mounted in the conventional arc ion plating apparatus shown in FIG. 2, and then, under the same conditions as in Example 4, a hard coating layer of nitride compound, which had a designated composition of metallic elements and a designated layer thickness shown in TABLE 23, was formed on the surface of each of the hard substrates using a physical vapor deposition method, and thereby coated end mills 1H to 8H of the present invention, as the coated cutting tools of the present invention, were fabricated.

For the purpose of comparison, the hard substrates H-1 to H-8 were subjected to ultrasonic cleaning in acetone, and then the hard substrates H-1 to H-8 were dried, and were mounted in the conventional arc ion plating apparatus shown in FIG. 2, and then, under the same conditions as in Example 4, a hard coating layer of nitride compound, which had a designated composition of metallic elements and a designated layer thickness shown in TABLE 24, was formed on the surface of each of the hard substrates using a physical vapor deposition method, and thereby conventional coated end mills 1h to 8h, as conventional coated cutting tools, were fabricated.

Next, among the coated end mills 1H to 8H of the present invention and the conventional coated end mills 1h to 8h, the coated end mills 1H to 3H of the present invention and the conventional coated end mills 1h to 3h were subjected to wet and high-speed side milling tests in which workpieces of cast iron were machined (while using a water-miscible cutting fluid) under the following conditions, workpiece: a plate of FC300 defined in the JIS having a plane size of 100 mm×250 mm, and a thickness of 50 mm,
cutting speed: 250 m/min,
depth of cut in the axial direction: 6 mm,
depth of cut in the radial direction: 1 mm, and
table feed: 600 mm/min.

The coated end mills 4H to 6H of the present invention and the conventional coated end mills 4h to 6h were subjected to wet and high-speed side milling tests in which workpieces of alloy steel were machined (while using a water-miscible cutting fluid) under the following conditions, workpiece: a plate of SCM440 defined in the JIS having a plane size of 100 mm×250 mm, and a thickness of 50 mm, cutting speed: 200 m/min,
depth of cut in the axial direction: 10 mm,
depth of cut in the radial direction: 2 mm, and
table feed: 300 mm/min.

The coated end mills 7H and 8H of the present invention and the conventional coated end mills 7h and 8h were subjected to wet and high-speed side milling tests in which workpieces of alloy steel were machined (while using a water-miscible cutting fluid) under the following conditions, workpiece: a plate of SNCM439 defined in the JIS having a plane size of 100 mm×250 mm, and a thickness of 50 mm, cutting speed: 200 m/min,
depth of cut in the axial direction: 20 mm,
depth of cut in the radial direction: 3 mm, and
table feed: 150 mm/min.

In each of the wet side milling tests (in which a water-miscible cutting fluid was used), a milling operation was performed until flank wear width of the cutting edge portion reached 0.1 mm, which indicates the end of the tool life, and the length of cut groove was measured. The test results are shown in TABLES 23 and 24.

TABLE 22

| Classification | | Co | (Ti, W)C | TaC | NbC | ZrC | $Cr_3C_2$ | VC | WC | Diameter × length of cutting edge (mm) |
|---|---|---|---|---|---|---|---|---|---|---|
| Substrate | H-1 | 12 | — | — | — | — | 0.8 | — | Fine grain: Balance | 6 × 13 |
| | H-2 | 10 | — | — | — | — | 0.4 | 0.4 | Fine grain: Balance | 6 × 13 |
| | H-3 | 8.5 | 10 | 10 | 7 | — | — | — | Medium coarse grain: Balance | 6 × 13 |
| | H-4 | 10 | — | — | — | — | 0.5 | — | Fine grain: Balance | 10 × 22 |
| | H-5 | 9 | 8 | 9 | 1 | — | — | — | Medium coarse grain: Balance | 10 × 22 |
| | H-6 | 6 | — | 1 | — | — | — | — | Fine grain: Balance | 10 × 22 |
| | H-7 | 11 | — | — | — | — | 1 | — | Fine grain: Balance | 20 × 45 |
| | H-8 | 8 | 5 | 1 | 5 | 5 | — | — | Medium coarse grain: Balance | 20 × 45 |

TABLE 23

| Classification | Symbols | Symbols of substrate | Hard coating layer | | | | | Designated layer thickness (μm) | Length of cut (m) |
|---|---|---|---|---|---|---|---|---|---|
| | | | Designated composition (atomic ratio) | | | | | | |
| | | | Al | Zr | Y | Ce | Ti | | |
| Coated end mill of the invention | 1H | H-1 | 0.45 | 0.020 | 0.0050 | — | Balance | 1 | 66 |
| | 2H | H-2 | 0.45 | 0.020 | — | 0.0050 | Balance | 1 | 54 |
| | 3H | H-3 | 0.20 | 0.020 | 0.0030 | 0.0030 | Balance | 1 | 69 |
| | 4H | H-4 | 0.50 | 0.040 | 0.0200 | — | Balance | 3 | 60 |
| | 5H | H-5 | 0.30 | 0.060 | 0.0010 | — | Balance | 3 | 54 |
| | 6H | H-6 | 0.30 | 0.002 | 0.0500 | — | Balance | 3 | 57 |
| | 7H | H-7 | 0.55 | 0.010 | 0.0030 | — | Balance | 3 | 51 |
| | 8H | H-8 | 0.10 | 0.030 | — | 0.0100 | Balance | 3 | 60 |

TABLE 24

| Classification | Symbols | Symbols of substrate | Hard coating layer | | | | | | | Designated layer thickness (μm) | Length of cut (m) |
|---|---|---|---|---|---|---|---|---|---|---|---|
| | | | Designated composition (atomic ratio) | | | | | | | | |
| | | | Ti | Al | Si | Y | Zr | Nb | Cr | | |
| Conv. coated end mill | 1h | H-1 | 0.50 | 0.50 | — | — | — | — | — | 1 | 22 |
| | 2h | H-2 | 0.50 | 0.45 | 0.05 | — | — | — | — | 1 | 20 |
| | 3h | H-3 | 0.70 | 0.10 | 0.20 | — | — | — | — | 1 | 25 |
| | 4h | H-4 | 0.65 | 0.30 | — | 0.05 | — | — | — | 3 | 19 |
| | 5h | H-5 | 0.40 | 0.40 | — | 0.20 | — | — | — | 3 | 19 |
| | 6h | H-6 | 0.65 | 0.25 | — | — | 0.10 | — | — | 3 | 23 |
| | 7h | H-7 | 0.35 | 0.55 | — | — | — | 0.10 | — | 3 | 25 |
| | 8h | H-8 | 0.40 | 0.40 | — | — | — | — | 0.20 | 3 | 24 |

EXAMPLE 6

The three types of sintered round bars having diameters of 8 mm, 13 mm, or 26 mm, respectively, fabricated in Example 5 were subjected to grinding so as to obtain hard substrates I-1 to I-8 of WC based hard metal formed in a drill shape in which two cutting edges with a twist angle of 30° were provided, and in which fluted portion sizes (diameter× length) were set in one of 4 mm×13 mm, 8 mm×22 mm, and 16 mm×45 mm, as shown in FIG. 25.

Next, honing processes were applied to the cutting edges of the hard substrates I-1 to I-8, the hard substrates I-1 to I-8 were subjected to ultrasonic cleaning in acetone, were dried, and were mounted in the conventional arc ion plating apparatus shown in FIG. 2, and then, under the same conditions as in Example 4, a hard coating layer of nitride compound, which had a designated composition of metallic elements and a designated layer thickness shown in TABLE 26, was formed on the surface of each of the hard substrates using a physical vapor deposition method, and thereby coated drills 1I to 8I of the present invention, as the coated cutting tools of the present invention, were fabricated.

For the purpose of comparison, the hard substrates I-1 to I-8 were subjected to ultrasonic cleaning in acetone, and then the hard substrates I-1 to I-8 were dried, and were mounted in the conventional arc ion plating apparatus shown in FIG. 2, and then, under the same conditions as in Example 4, a hard coating layer of nitride compound, which had a designated composition of metallic elements and a designated layer thickness shown in TABLE 27, was formed on the surface of each of the hard substrates using a physical vapor deposition method, and thereby conventional coated drills 1i to 8i, as conventional coated cutting tools, were fabricated.

Next, among the coated drills 1I to 8I of the present invention and the conventional coated drills 1i to 8i, the coated drills 1I to 3I of the present invention and the conventional coated drills 1i to 3i were subjected to wet and high-speed drilling tests in which workpieces of cast iron were machined (while using a water-miscible cutting fluid) under the following conditions, workpiece: a plate of FC300 defined in the JIS having a plane size of 100 mm×250 mm, and a thickness of 50 mm,
cutting speed: 150 m/min,
feed: 0.2 mm/rev, and
depth of hole: 8 mm.

The coated drills 4I to 6I of the present invention and the conventional coated drills 4i to 6i were subjected to wet and high-speed drilling tests in which workpieces of alloy steel were machined (while using a water-miscible cutting fluid) under the following conditions, workpiece: a plate of SCM440 defined in the JIS having a plane size of 100 mm×250 mm, and a thickness of 50 mm,
cutting speed: 150 m/min,
feed: 0.2 mm/rev, and
depth of hole: 16 mm.

The coated hard metal drills 7I and 8I of the present invention and the conventional coated hard metal drills 7i and 8i were subjected to wet and high-speed drilling tests in which workpieces of alloy steel were machined (while using a water-miscible cutting fluid) under the following conditions, workpiece: a plate of SNCM439 defined in the JIS having a plane size of 100 mm×250 mm, and a thickness of 50 mm,
cutting speed: 200 m/min,
feed: 0.3 mm/rev, and
depth of hole: 30 mm.

In each of the wet and high-speed drilling tests with a large depth of cut (in which a water-miscible cutting fluid was used), holes were formed until flank wear width of the cutting edge of the tip portion reached 0.3 mm, and the number of the holes was counted. The test results are shown in TABLES 26 and 27.

TABLE 25

| Classification | | Co | (Ti, W)C | TaC | NbC | ZrC | $Cr_3C_2$ | VC | WC | Diameter × length of cutting edge (mm) |
|---|---|---|---|---|---|---|---|---|---|---|
| Substrate | I-1 | 12 | — | — | — | — | 0.8 | — | Fine grain: Balance | 4 × 13 |
| | I-2 | 10 | — | — | — | — | 0.4 | 0.4 | Fine grain: Balance | 4 × 13 |
| | I-3 | 8.5 | 10 | 10 | 7 | — | — | — | Medium coarse grain: Balance | 4 × 13 |
| | I-4 | 10 | — | — | — | — | 0.5 | — | Fine grain: Balance | 8 × 22 |
| | I-5 | 9 | 8 | 9 | 1 | — | — | — | Medium coarse grain: Balance | 8 × 22 |
| | I-6 | 6 | — | 1 | — | — | — | — | Fine grain: Balance | 8 × 22 |
| | I-7 | 11 | — | — | — | — | 1 | — | Fine grain: Balance | 16 × 45 |
| | I-8 | 8 | 5 | 1 | 5 | 5 | — | — | Medium coarse grain: Balance | 16 × 45 |

TABLE 26

| Classification | | Symbols of substrate | Hard coating layer | | | | | Designated layer thickness (μm) | Number of drilled holes |
|---|---|---|---|---|---|---|---|---|---|
| | | | Designated composition (atomic ratio) | | | | | | |
| | | | Al | Zr | Y | Ce | Ti | | |
| Coated end mill of the invention | 1I | I-1 | 0.45 | 0.020 | 0.0050 | — | Balance | 1 | 1050 |
| | 2I | I-2 | 0.45 | 0.020 | — | 0.0050 | Balance | 1 | 1150 |
| | 3I | I-3 | 0.20 | 0.020 | 0.0030 | 0.0030 | Balance | 1 | 1100 |
| | 4I | I-4 | 0.50 | 0.040 | 0.0200 | — | Balance | 3 | 750 |
| | 5I | I-5 | 0.30 | 0.060 | 0.0010 | — | Balance | 3 | 850 |
| | 6I | I-6 | 0.30 | 0.002 | 0.0500 | — | Balance | 3 | 800 |
| | 7I | I-7 | 0.55 | 0.010 | 0.0030 | — | Balance | 3 | 360 |
| | 8I | I-8 | 0.10 | 0.030 | — | 0.0100 | Balance | 3 | 340 |

TABLE 27

| Classification | | Symbols of substrate | Hard coating layer | | | | | | | Designated layer thickness (μm) | Number of drilled holes |
|---|---|---|---|---|---|---|---|---|---|---|---|
| | | | Designated composition (atomic ratio) | | | | | | | | |
| | | | Ti | Al | Si | Y | Zr | Nb | Cr | | |
| Conv. coated end mill | 1h | I-1 | 0.50 | 0.50 | — | — | — | — | — | 1 | 280 |
| | 2i | I-2 | 0.50 | 0.45 | 0.05 | — | — | — | — | 1 | 280 |
| | 3i | I-3 | 0.70 | 0.10 | 0.20 | — | — | — | — | 1 | 260 |
| | 4i | I-4 | 0.65 | 0.30 | — | 0.05 | — | — | — | 3 | 200 |
| | 5i | I-5 | 0.40 | 0.40 | — | 0.20 | — | — | — | 3 | 220 |
| | 6i | I-6 | 0.65 | 0.25 | — | — | 0.10 | — | — | 3 | 200 |
| | 7i | I-7 | 0.35 | 0.55 | — | — | — | 0.10 | — | 3 | 80 |
| | 8i | I-8 | 0.40 | 0.40 | — | — | — | — | 0.20 | 3 | 90 |

The compositions of the hard coating layers which were included in the coated cutting tools of the present invention, i.e., in the coated inserts 1E to 10E, 1F to 6F, and 1G to 6G of the present invention, in the coated end mills 1H to 8H of the present invention, and in the coated drills 1I to 8I of the present invention; the compositions of the hard coating layers which were included in the conventional coated cutting tools, i.e., in the conventional coated inserts 1e to 10e, 1f to 6f, and 1g to 6g, in the conventional coated end mills 1h to 8h, and in the conventional coated drills 1i to 8i; and the compositions of the maximum Al containing points and the minimum Al containing points of the hard coating layers which were included in the coated cutting tools of the present invention, i.e., in the coated inserts 11E to 20E, 7F to 12F, and 7G to 12G of the present invention, were analyzed using an Auger electron spectroscopic analyzer, and it was confirmed that the compositions were substantially the same as the designated compositions, respectively.

In addition, the distances between the maximum Al containing points and the minimum Al containing points, and the overall thicknesses of the hard coating layers of the coated cutting tools of the present invention, and the overall thicknesses of the hard coating layers of the conventional coated cutting tools were measured using a scanning electron microscope, and it was confirmed that the distances and thicknesses were substantially the same as the designated ones, respectively.

According to the results shown in TABLES 13 to 24, it is apparent that all of the coated inserts 11E to 20E, 7F to 12F, and 7G to 12G of the present invention, the coated end mills 1H to 8H of the present invention, and the coated drills 1I to 8I of the present invention exhibit superior wear resistance and have normal wear in the cutting edges during the cutting operations under high speed conditions, and, in addition, the coated inserts 11E to 20E, 7F to 12F, and 7G to 12G of the present invention exhibit superior cutting performance without having chipping even during the cutting operations under high speed and severe conditions. In contrast, it is apparent that the conventional coated inserts 1e to 10e, 1f to 6f, and 1g to 6g, the conventional coated end mills 1h to 8h, and the conventional coated drills 1i to 8i exhibit relatively short tool life due to insufficient wear resistance and toughness of the hard coating layer.

INDUSTRIAL APPLICABILITY

As explained above, because the coated cutting tools of the present invention exhibit a superior chipping resistance not only during high-speed cutting operations under normal conditions, but also during high-speed cutting operations, in particular, for various kinds of steels and cast irons under severe conditions, such as with a large depth of cut or a large feed, and exhibit a superior wear resistance for a long term, the coated cutting tools of the present invention can sufficiently meet the demands of lower power, less energy, and lower cost in cutting operations.

The invention claimed is:

1. A coated cutting tool member whose hard coating layer exhibits a superior chipping resistance during a high speed and severe cutting operation, the coated cutting tool member comprising:
  a hard substrate; and
  a hard coating layer of a nitride compound containing Ti, Al, and Zr, which is formed on a surface of the hard substrate using a physical vapor deposition method at an overall average thickness of 1 to 15 µm, wherein the hard coating layer has a component composition profile in which maximum Al containing points and minimum Al containing points appear alternately and repeatedly at a predetermined interval in a direction of thickness of the hard coating layer, and the amount of contained A1 component continuously varies from the maximum Al containing points to the minimum Al containing points and from the minimum Al containing points to the maximum Al containing points, the maximum Al containing points satisfy a composition formula of $(Ti_{1-(X+Y)}Al_XZr_Y)N$ (where X indicates an atomic ratio of 0.45 to 0.65, and Y indicates an atomic ratio of 0.01 to 0.15) and the minimum Al containing points satisfy a composition formula of $(Ti_{1-(X+Y)}Al_XZr_Y)N$ (where X indicates an atomic ratio of 0.15 to 0.40, and Y indicates an atomic ratio of 0.01 to 0.15), and a distance between one of the maximum Al containing points and adjacent one of the minimum Al containing points is from 0.01 to 0.1 µm.

2. A coated cutting tool member according to claim 1, wherein the hard substrate is made of hard metal containing tungsten carbide.

3. A coated cutting tool member according to claim 1, wherein the hard substrate is made of cermet containing titanium carbonitride.

4. A coated cutting tool member according to claim 1, wherein the hard substrate is made of sintered material containing cubic boron nitride.

5. A coated cutting tool member exhibiting a superior wear resistance, comprising:

a hard substrate; and a hard coating layer of a nitride compound containing Ti and Al which is formed on a surface of the hard substrate using a physical vapor deposition method at an overall average thickness of 1 to 10 µm, wherein the hard coating layer comprises Zr at an atomic ratio of 0.002 to 0.1, and at least one of Y and Ce at an atomic ratio of 0.0005 to 0.05 in a coexistence state the hard coating layer has a component composition profile in which maximum Al containing points and minimum Al containing points appear alternately and repeatedly at a predetermined interval in a direction of thickness of the hard coating layer, and the amount of contained Al component continuously varies from the maximum Al containing points to the minimum Al containing points and from the minimum Al containing points to the maximum Al containing points, maximum Al containing points contain Al component at an atomic ratio of 0.40 to 0.60 with respect to entire metal components, and the minimum Al containing points contain Al component at an atomic ratio of 0.05 to 0.25 with respect to entire metal components, and a distance between one of the maximum Al containing points and adjacent one of the minimum Al containing points is from 0.01 to 0.1 µm.

6. A coated cutting tool member according to claim 5, wherein the hard substrate is made of hard metal containing tungsten carbide.

7. A coated cutting tool member according to claim 5, wherein the hard substrate is made of cement containing titanium carbonitride.

8. A coated cutting tool member according to claim 5, wherein the hard substrate is made of sintered material containing cubic boron nitride.

9. A method for forming a hard coating layer exhibiting a superior chipping resistance during a high speed and severe cutting operation on a surface of a cutting tool substrate, the method comprising:

mounting the cutting tool substrate on a turntable housed in an arc ion plating apparatus at a position radially away from a center axis of the turntable in a manner rotatable about an axis of the cutting tool substrate;

producing a nitrogen gas atmosphere as the reaction atmosphere in the arc ion plating apparatus; and generating arc discharge between a cathode electrode of a Ti—Al—Zr alloy piece for forming maximum Al containing points and an anode electrode, and between another cathode electrode of a Ti—Al—Zr alloy piece for forming minimum Al containing points, which is disposed so as to oppose to the other cathode electrode with respect to the turntable, and another anode electrode, so that a hard coating layer of a nitride compound containing Ti, Al, and Zr having overall average thickness of 1 to 15 µm is formed, by a physical vapor deposition method, on the surface of the cutting tool substrate being turned while rotating on the turntable about an axis of the cutting tool substrate, wherein the hard coating layer has a component composition profile in which the maximum Al containing points and the minimum Al containing points appear alternately and repeatedly at a predetermined interval in a direction of thickness of the hard coating layer, and the amount of contained Al component continuously varies from the maximum Al containing points to the minimum Al containing points and from the minimum Al containing points to the maximum Al containing points, the maximum Al containing points satisfy a composition formula of $(Ti_{1-(X+Y)}Al_XZr_Y)N$ (where X indicates an atomic ratio of 0.45 to 0.65, and Y indicates an atomic ratio of 0.01 to 0.15) and the minimum Al containing points satisfy a composition formula of $(Ti_{1-(X+Y)}Al_XZr_Y)N$ (where X indicates an atomic ratio of 0.15 to 0.40, and Y indicates an atomic ratio of 0.01 to 0.15), and a distance between one of the maximum Al containing points and adjacent one of the minimum Al containing points is from 0.01 to 0.1 µm.

10. A coated cutting tool member according to claim 9, wherein the hard substrate is made of hard metal containing tungsten carbide.

11. A coated cutting tool member according to claim 9, wherein the hard substrate is made of cermet containing titanium carbonitride.

12. A coated cutting tool member according to claim 9, wherein the hard substrate is made of sintered material containing cubic boron nitride.

13. A coated cutting tool member exhibiting a superior wear resistance, comprising:

a hard substrate; and a hard coating layer of a carbonitride compound containing Ti and Al which is formed on a surface of the hard substrate using a physical vapor deposition method at an overall average thickness of 1 to 10 µm, wherein the hard coating layer comprises Zr at an atomic ratio of 0.002 to 0.1, and at least one of Y and Ce at an atomic ratio of 0.0005 to 0.05 in a coexistence state, the hard coating layer has a component composition profile in which maximum Al containing points and minimum Al containing points appear alternately and repeatedly at a predetermined interval in a direction of thickness of the hard coating layer, and the amount of contained Al component continuously varies from the maximum Al containing points to the minimum Al containing points and from the minimum Al containing points to the maximum Al containing points, maximum Al containing points contain Al component at an atomic ratio of 0.40 to 0.60 with respect to entire metal components, and the minimum Al containing points contain Al component at an atomic ratio of 0.05 to 0.25 with respect to entire metal components, and a distance between one of the maximum Al containing points and adjacent one of the minimum Al containing points is from 0.01 to 0.1 μm.

14. A coated cutting tool member according to claim 13, wherein the hard substrate is made of hard metal containing tungsten carbide.

15. A coated cutting tool member according to claim 13, wherein the hard substrate is made of cermet containing titanium carbonitride.

16. A coated cutting tool member according to claim 13, wherein the hard substrate is made of sintered material containing cubic boron nitride.

* * * * *